US012656423B2

(12) United States Patent
Igarashi et al.

(10) Patent No.: US 12,656,423 B2
(45) Date of Patent: Jun. 16, 2026

(54) FLUORESCENCE DETECTION DEVICE AND FLUORESCENCE DETECTION METHOD

(71) Applicant: National Institutes for Quantum Science and Technology, Chiba (JP)

(72) Inventors: Ryuji Igarashi, Chiba (JP); Tamami Yanagi, Chiba (JP); Kiichi Kaminaga, Chiba (JP)

(73) Assignee: National Institutes for Quantum Science and Technology, Chiba (JP)

( * ) Notice: Subject to any disclaimer, the term of this patent is extended or adjusted under 35 U.S.C. 154(b) by 26 days.

(21) Appl. No.: 18/572,231

(22) PCT Filed: Jun. 22, 2022

(86) PCT No.: PCT/JP2022/024792
§ 371 (c)(1),
(2) Date: Dec. 20, 2023

(87) PCT Pub. No.: WO2022/270519
PCT Pub. Date: Dec. 29, 2022

(65) Prior Publication Data
US 2024/0288516 A1 Aug. 29, 2024

(30) Foreign Application Priority Data
Jun. 23, 2021 (JP) ................................ 2021-104440

(51) Int. Cl.
*G01R 33/26* (2006.01)
(52) U.S. Cl.
CPC .................................. *G01R 33/26* (2013.01)

(58) Field of Classification Search
CPC ................ G01R 33/26; G01R 33/0005; G01R 33/0017; G01R 33/032; G01R 33/0354; G02B 6/32; G02B 6/4202
See application file for complete search history.

(56) References Cited

U.S. PATENT DOCUMENTS 5,909,278 A     6/1999  Deka et al.
2011/0062957 A1*  3/2011  Fu ......................... G01N 24/088
                                                        324/307
(Continued)

FOREIGN PATENT DOCUMENTS

CN      102272575  A     12/2011
CN      109143121  A      1/2019
(Continued)

OTHER PUBLICATIONS

Yanagi, Tamami et al., "All-Optical Wide-Field Selective Imaging of Fluorescent Nanodiamonds in Cells, in Vivo and Ex Vivo", ACS Nano, published Aug. 2, 2021, vol. 15, No. 8, p. 12869-p. 12879.
(Continued)

*Primary Examiner* — Lee E Rodak
*Assistant Examiner* — Taqi R Nasir
(74) *Attorney, Agent, or Firm* — NK Patent Law

(57) ABSTRACT
Provided is a technique of identifying fluorescence emitted from a measurement target, the measurement accuracy of the technique being improved by processing data also including background light. A fluorescence detection device includes: a first generating section that generates excitation light whose intensity is modulated and which excites a phosphor that emits fluorescence whose intensity varies according to magnetic resonance; and a second generating section that
(Continued)

generates a magnetic field or an electromagnetic wave each of which causes the magnetic resonance so that the intensity of the fluorescence emitted from the phosphor is changed.

9 Claims, 20 Drawing Sheets

(56) References Cited

U.S. PATENT DOCUMENTS

| | | | |
|---|---|---|---|
| 2011/0278471 A1 | 11/2011 | Hoshishima | |
| 2017/0343695 A1* | 11/2017 | Stetson | G01V 3/101 |
| 2017/0370979 A1* | 12/2017 | Braje | G01R 29/0885 |
| 2018/0120219 A1 | 5/2018 | Bumb et al. | |
| 2019/0277842 A1 | 9/2019 | Cleveland | |
| 2020/0334559 A1* | 10/2020 | Anderson | G06N 20/00 |

FOREIGN PATENT DOCUMENTS

| | | |
|---|---|---|
| CN | 109342548 A | 2/2019 |
| DE | 102018220234 A1 | 5/2020 |
| JP | 10104181 A | 4/1988 |
| JP | 2000210246 A | 8/2000 |
| JP | 2011180570 A | 9/2011 |
| JP | 2012211811 A | 11/2012 |
| JP | 2018136316 A | 8/2018 |
| JP | 2021510837 A | 4/2021 |
| RU | 2412486 C1 | 2/2011 |

OTHER PUBLICATIONS

ISA/JP; International Search Report and Written Opinion for corresponding International Patent Application No. PCT/JP2022/024792, mailed Aug. 30, 2022, 13 pages.

ISA/JP; International Search Report and Written Opinion for corresponding International Patent Application No. PCT/JP2022/024793, mailed Aug. 30, 2022, 11 pages.

Claveau, Sandra et al: "Harnessing subcellular-resolved organ distribution of cationic copolymer-functionalized fluorescent nandiamonds for optimal delivery of active siRNA to a xenografted tumor in mice", Nanoscale, vol. 13, No. 20, May 27, 2021 (May 27, 2021), pp. 9280-9292, XP093272710, United Kingdom.

EPO, Extended European Search Report for corresponding European Patent Application No. 22828435.2, mailed May 12, 2025, 10 pages.

EPO, Extended European Search Report for Corresponding European Patent Application No. 22828436.0, mailed May 12, 2025, 8 pages.

Igarashi, Ryuji et al: "Real-Time Background-Free Imaging of Fluorescent Nanodiamonds in Vivo", NANO Letters, Mar. 11, 2020 American Chemical Society, US, vol. 12, No. 11, Oct. 22, 2012 (Oct. 22, 2012), pp. 5726-5732, XP093272703.

Sarkar, Susanta K. et al: "Wide-field in vivo background free imaging by selective magnetic modulation of nanodiamond fluorescence", Biomedical Optics Express, vol. 5, No. 4, Mar. 13, 2014 (Mar. 14, 2014), p. 1190, XP055594652, United States.

Yang, Bo et al.: "Using Diamond Quantum Magnetometer to Characterize Near-Field Distribution of Patch Antenna", IEEE Transactions on Microwave Theory and Techniques, IEEE, USA, vol. 67, No. 6, Jun. 1, 2019 (Jun. 1, 2019), pp. 2451-2460, XP011727972.

USPTO, Office Action for corresponding U.S. Appl. No. 18/572,265, dated Jul. 14, 2025, 21 pages.

CNIPA; The First Office Action for corresponding Chinese Patent Application No. 202280042590.7, dated Mar. 21, 2026, 22 pages.

CNIPA; The First Office Action for corresponding Chinese Patent Application No. 202280042966.4, dated Mar. 11, 2026, 15 pages.

Liu Gang-Qin et al., "Quantum control of nitrogen-vacancy center in diamond", Acta Physica Sinica, vol. 67, No. 12 (2018), 43 pages.

Zhou Shuyu et al.; Progress in Laser-Cooled Atom Experiments at the Quantum Optics Laboratory of the Shanghai Institute of Optics and Mechanics, Proceedings of the 9th National Conference on Quantum Optics (vol. I), dated Jul. 18, 2000, 3 pages.

* cited by examiner

Fluorescence intensity

Pulse intensity

Magnetic field

Fluorescence intensity

Pulse intensity

Intensity or frequency of microwave

Fluorescence intensity

Pulse intensity

Pulse frequency

FIG. 16

FLUORESCENCE DETECTION DEVICE AND FLUORESCENCE DETECTION METHOD

CROSS-REFERENCE TO RELATED APPLICATIONS

This application is a U.S. National Stage Application of International Patent Application No. PCT/JP2022/024792, filed on Jun. 22, 2022, which claims priority to Japanese Patent Application No. 2021-104440, filed on Jun. 23, 2021, the entire contents of all of which are incorporated by reference herein.

TECHNICAL FIELD

The present invention relates to a fluorescence detection device and a fluorescence detection method.

BACKGROUND ART

There are known analytical methods in which fluorescence emitted when excited electrons return to a ground state is used. For example, a diamond having a nitrogen-vacancy center (NV center), which contains nitrogen that substitutes for a carbon atom and a vacancy that is adjacent to the nitrogen, is known as a phosphor which allows the intensity of fluorescence emitted from the NV center to be controlled by magnetic resonance. Various methods of using a minute diamond (nanodiamond) having an NV center, such as use thereof as a marker or a magnetic sensor each of which generates fluorescence, have been studied.

In a case where a nanodiamond is used as a marker that generates fluorescence, there is a problem that it is difficult to distinguish between fluorescence emitted from an NV center and fluorescence emitted from the others. Patent Literature 1 discloses a fluorescence microscope that makes it possible to carry out selective field observation of fluorescence of interest. In this technique, an NV center included in a measurement target is irradiated with a high-frequency magnetic field so that the intensity of fluorescence emitted from the NV center is changed. This makes it possible to distinguish between the fluorescence which is emitted from the NV center and fluorescence which is emitted from an object other than the NV center and whose intensity does not change.

CITATION LIST

Patent Literature

Patent Literature 1

Japanese Patent Application Publication Tokukai No. 2011-180570

SUMMARY OF INVENTION

Technical Problem

However, in the above-described conventional technique, it is possible to detect only fluorescence emitted from an NV center. However, fluorescence emitted from an object other than the NV center (background light) is not processed as measurement data. Therefore, there is a problem that it is not possible to obtain a signal to background ratio that exceeds a signal to noise ratio (SNR).

The object of an aspect of the present invention is to provide a technique of identifying fluorescence emitted from a measurement target, the measurement accuracy of the technique being improved by processing data also including background light.

Solution to Problem

In order to attain the above object, a fluorescence detection device in accordance with an aspect of the present invention includes: a first generating section that generates excitation light whose intensity is modulated and which excites a phosphor that emits fluorescence whose intensity varies according to magnetic resonance; and a second generating section that generates a magnetic field or an electromagnetic wave each of which causes the magnetic resonance so that the intensity of the fluorescence emitted from the phosphor is changed.

In order to attain the above object, a fluorescence detection method in accordance with an aspect of the present invention is a method for detecting fluorescence which is emitted from a phosphor and whose intensity varies according to magnetic resonance, the method including the steps of: changing intensity of background light; and changing intensity of fluorescence emitted from the phosphor.

Advantageous Effects of Invention

According to an aspect of the present invention, it is possible to provide a technique of identifying fluorescence emitted from a measurement target, the measurement accuracy of the technique being improved by processing data also including background light.

BRIEF DESCRIPTION OF DRAWINGS

FIG. 16 shows zero-field splitting widths obtained by ODMR frequency spectra, in accordance with Example 3.

DESCRIPTION OF EMBODIMENTS

Embodiment 1

(Configuration of Fluorescence Detection Device 1)

Figure 1:
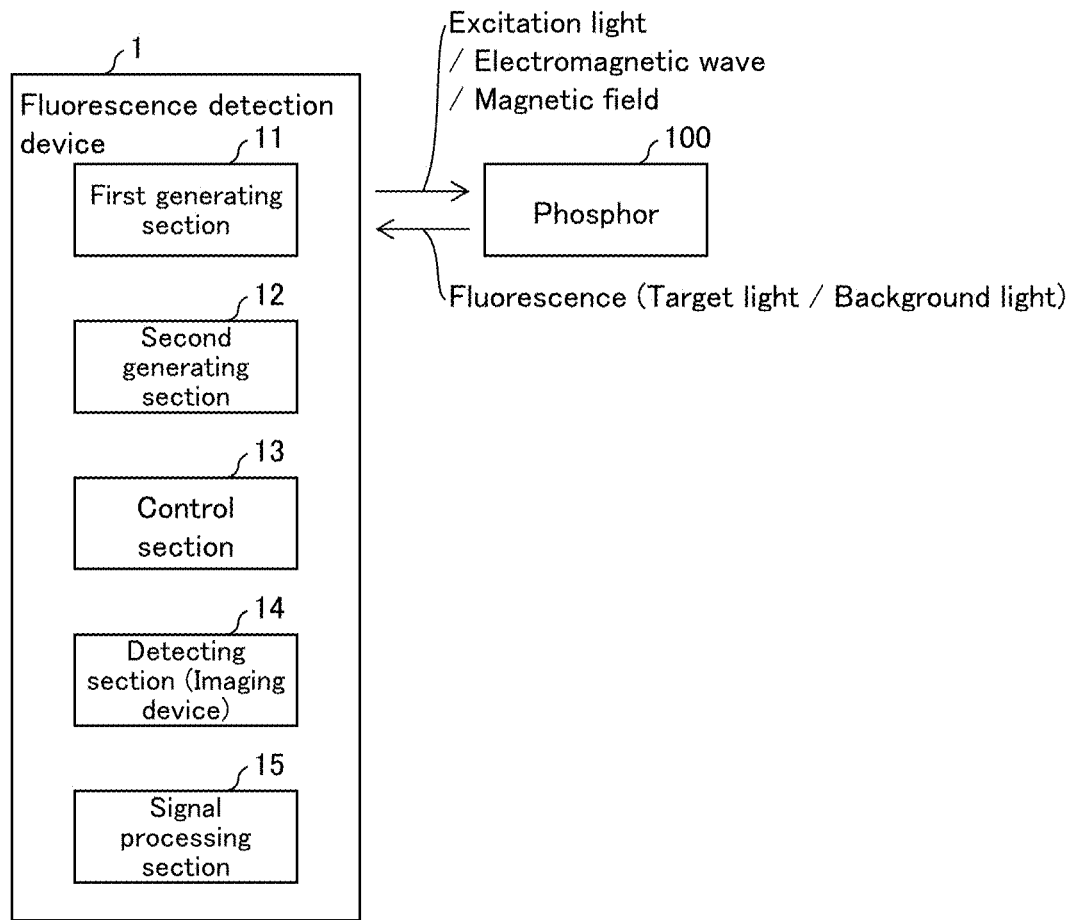
FIG. 1 is a block diagram of a fluorescence detection device in accordance with Embodiment 1.

The following description will discuss, in detail, an embodiment of the present invention with reference to a drawing. FIG. 1 is a block diagram of a fluorescence detection device 1 in accordance with Embodiment 1. As illustrated in FIG. 1, the fluorescence detection device 1 includes a first generating section 11, a second generating section 12, a control section 13, a detecting section (imaging device) 14, and a signal processing section 15.

The first generating section 11 generates excitation light whose intensity is modulated and which excites a phosphor that emits fluorescence whose intensity varies according to magnetic resonance. The phosphor is a substance which emits energy as visible light when an energy state of electrons of an atom or a molecule transitions from an excited state to a ground state. The phosphor that emits fluorescence whose intensity varies according to magnetic resonance is, for example, a phosphor that emits fluorescence whose intensity changes in a case where a spin state of electrons present in a crystal lattice defect is changed by magnetic resonance.

For example, in a case where a lattice defect structure in a diamond which lattice defect structure contains a nitrogen atom that substitutes for a carbon atom and a vacancy that is adjacent to the nitrogen atom (referred to as an NV center) is irradiated with green light (wavelength: 495 nm to 570 nm) or light having a wavelength twice the wavelength of the green light, electrons transition to an excited state, and then emit fluorescence of red light when the electrons return to a ground state. In this case, the NV center of the diamond is the phosphor, and the green light or the light having a wavelength twice the wavelength of the green light is the excitation light that excites the phosphor.

Specifically, in the case of the NV center of the diamond, in a case where a spin magnetic quantum number in the ground state is $m_s=0$, almost all of excited electrons transition to $m_s=0$ in the ground state again while emitting fluorescence of 650 nm to 750 nm. In contrast, in a case where the spin magnetic quantum number is $m_s=\pm1$, approximately 50% of the excited electrons undergo inter-system crossing to a singlet state, and transition to $m_s=0$ in the ground state without emitting fluorescence. Therefore, in a case where photoexcitation is carried out for a sufficiently long time (several microseconds), almost 100% of triplet electrons are pumped to $m_s=0$. This spin-dependent optical property causes a difference of approximately 5% to 10% in fluorescence intensity between a thermal equilibrium state and a pumped state. The following embodiment is described while the NV center of the diamond (hereinafter, simply referred to as "NV center") is taken as an example of a phosphor 100. Note that the diamond used for fluorescence measurement is a nano-sized diamond and, therefore, this diamond is also referred to as a fluorescent nanodiamond.

The first generating section 11 generates the excitation light whose intensity is modulated. In the present embodiment, that intensity is modulated means that the intensity changes with time. The excitation light may be continuous light or may be pulsed light ejected in a pulsed manner (intermittently). In a case where the intensity of the continuous light is modulated, the amplitude of the continuous light is changed. In a case where the intensity of the pulsed light is changed, for example, the frequency (number of pulses per unit time) or the amplitude of the pulsed light is changed.

As illustrated in FIG. 1, the first generating section 11 irradiates the phosphor 100 with the generated excitation light. In a case where the phosphor 100 is irradiated with the excitation light whose intensity is modulated, the intensity of fluorescence other than fluorescence emitted from the phosphor 100 changes in synchronization with a pattern of modulation of the intensity of the excitation light. Hereinafter, the fluorescence emitted from the phosphor 100 is also referred to as "fluorescence from a target" or "target light", and the fluorescence emitted from an object other than the phosphor 100 is also referred to as "background light".

The second generating section 12 generates a magnetic field or an electromagnetic wave each of which causes the magnetic resonance so that the intensity of the fluorescence emitted from the phosphor (target light) is changed. That is, the magnetic field or the electromagnetic wave generated by the second generating section 12 is adjusted so that the intensity of the target light changes. In the present embodiment, the electromagnetic wave means a high-frequency magnetic field including a radio wave, a microwave, and the like. More specifically, the electrons of the NV center are such that, in a case where there is no external magnetic field and in a case where the electrons are irradiated with a high-frequency magnetic field of approximately 2.87 GHz, magnetic resonance occurs, the proportion of electrons in a quasi-ground state of $m_s=\pm1$ increases, and therefore the proportion of electrons that transition from an excited state to this quasi-ground state and emit fluorescence decreases. Therefore, the intensity of the fluorescence emitted from the NV center decreases. In order to use this phenomenon, the second generating section 12 generates a stationary high-frequency magnetic field of 2.87 GHz and an external magnetic field whose intensity, which causes, by Zeeman shift, modulation of the frequency of the high-frequency magnetic field that causes the magnetic resonance, is increased or decreased. Alternatively, the second generating section 12 generates a high-frequency magnetic field which is in the vicinity of 2.87 GHz and whose intensity or frequency is increased or decreased. As illustrated in FIG. 1, the second generating section 12 irradiates the phosphor 100, which is the measurement target, with the generated magnetic field or electromagnetic wave.

The control section 13 controls the entire fluorescence detection device 1. As the control section 13, any of various processors, such as a central processing unit (CPU), a micro processing unit (MPU), an application specific integrated circuit (ASIC), or a programmable logic device (PLD), can be used. The control section 13 includes a storage part (not illustrated) such as a read only memory (ROM) or a random access memory (RAM). In the storage part, various control programs and various pieces of data are stored. The control section 13 integrally controls the first generating section 11, the second generating section 12, the detecting section 14 (described later), and the signal processing section 15.

The detecting section (imaging device) 14 includes an imaging element such as a charge coupled device (CCD) or a complementary metal oxide semiconductor (CMOS), and receives the target light and the background light. The imaging element converts, for each pixel, the received fluorescence into an electric signal. The detecting section 14 transmits, to the signal processing section 15, electric signals obtained by the conversion.

The signal processing section 15 processes the electric signals received from the detecting section 14, and identifies the target light and the background light. Specifically, the signal processing section 15 distinguishes, for each pixel, a pattern of changes in the electric signal which pattern of changes corresponds to the fluorescence intensity of the target light. The signal processing section 15 then extracts pixels indicating the same pattern of changes as the pattern of changes in the frequency of the magnetic field or the electromagnetic wave generated by the second generating section 12. The signal processing section 15 may generate and output an image of the extracted pixels. The image generated by the signal processing section 15 is outputted to and displayed on a display provided to the fluorescence detection device 1 or an external display.

The pattern of changes in the electric signal will be described in more detail. In a case where the magnetic field or the electromagnetic wave is modulated so that the target light is changed, the intensity of the target light changes in synchronization with the modulation. The pattern of changes in the electric signal includes a pattern of change widths of intensity and a phase pattern of changes. The change widths of the intensity correspond to the change widths of the intensity of the magnetic field or the change widths of the intensity or the frequency of the electromagnetic wave. The phase pattern of changes corresponds to the modulated phase of the magnetic field or the electromagnetic wave. That is, a signal captured in a pixel in which a pattern of changes in the intensity of the signal synchronizes with such a pattern of changes of changes is the electric signal generated by the target light. Therefore, by extracting such a signal, it is possible to extract and identify the target light. Similarly, a signal captured in a pixel in which a pattern of changes in the intensity of the signal synchronizes with a pattern of change widths of the intensity of the excitation light and a phase pattern of changes is the electric signal generated by the background light.

In a case where the phosphor 100 is irradiated with the excitation light, not only the target light is emitted from the phosphor 100, but also fluorescence is emitted as the background light from a surrounding object. In a case where the target light and the background light are imaged as they are and in a case where the wavelengths of the target light and the background light are close to each other, it is not possible to distinguish between the target light and the background light. However, in the fluorescence detection device 1 in accordance with the present embodiment, the intensity of the magnetic field or the electromagnetic wave generated by the second generating section 12 is changed so that the intensity of the target light is changed. Meanwhile, the first generating section 11 modulates the intensity of the excitation light so that the intensity of the background light is changed. Therefore, it is possible to use the background light as information for identifying the background light. That is, measurement accuracy is improved by processing data including not only the target light but also the background light.

As described above, the fluorescence detection device 1 in accordance with the present embodiment brings about an effect that it is possible to improve measurement accuracy by processing data including also background light in addition to identifying fluorescence emitted from a measurement target (phosphor). That is, in the conventional technique, background light is only excluded, and cannot be processed as information. On the contrary, in the fluorescence detection device 1, it is possible to process background light as background information. Therefore, the fluorescence detecting device 1 brings about an effect that a signal to background ratio (SBR) is improved, as compared with the conventional technique. This means that accuracy of detection of fluorescence per unit time increases, and makes it possible to shorten a measurement time in a case where the same measurement target is measured.

(Fluorescence Detection Method)

Figure 2:
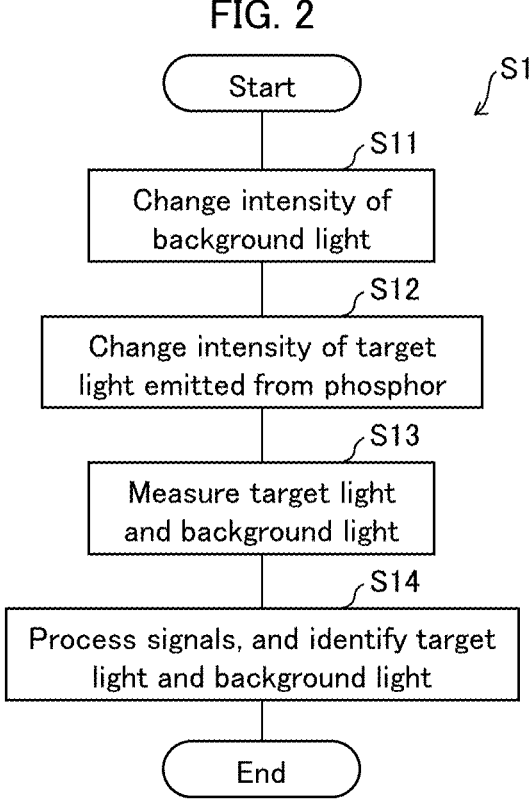
FIG. 2 is a flowchart illustrating a flow of a fluorescence detection method S1 in accordance with Embodiment 1.

Next, a fluorescence detection method in accordance with the present embodiment will be described with reference to a drawing. FIG. 2 is a flowchart illustrating a flow of a fluorescence detection method S1 in accordance with the present embodiment. As illustrated in FIG. 2, the fluorescence detection method S1 includes, as an example, steps S11 through S14. In the step S11, the fluorescence detection device 1 changes the intensity of background light. Specifically, a phosphor (measurement target) is irradiated with excitation light, which is generated by the first generating section 11 and whose intensity is modulated, so that the intensity of the background light is changed.

Further, in the step S12, the fluorescence detection device 1 changes the intensity of target light emitted from the phosphor. Specifically, the intensity of the target light emitted from the phosphor is changed by irradiating the phosphor with a magnetic field or an electromagnetic wave each of which is generated by the second generating section 12 and each of which causes magnetic resonance. Note that the steps S11 and S12 are carried out in parallel.

Next, in the step S13, the fluorescence detection device 1 measures the target light and the background light. Specifically, the target light and the background light are received with use of the imaging element of the detecting section 14. Next, in the step S14, the fluorescence detection device 1 processes signals, and identifies the target light and the background light. Specifically, by the signal processing section 15, a pattern of changes in an electric signal is obtained for each pixel, and pixels in each of which a pattern of changes in the intensity of the electric signal synchronizes with a pattern of modulation of the intensity of the excitation light and pixels in each of which a pattern of changes in the intensity of the electric signal synchronizes with a pattern of modulation of the magnetic field or the electromagnetic wave are identified.

The fluorescence detection method S1 in accordance with the present embodiment brings about an effect that it is possible to improve measurement accuracy by processing data also including background light in addition to identifying fluorescence emitted from a measurement target (phosphor).

Figure 10:
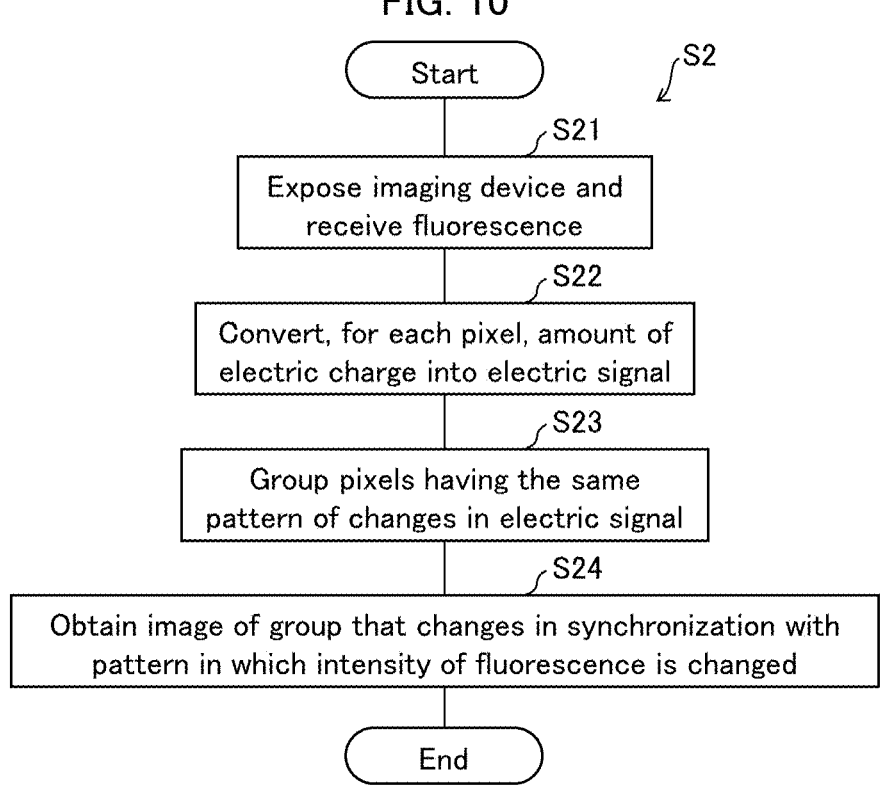
FIG. 10 is a flowchart illustrating a flow of a fluorescence identification method S2.

Next, an example of a method of measuring fluorescence and identifying target light and background light will be described. FIG. 10 is a flowchart illustrating a flow of a fluorescence identification method S2. As illustrated in FIG. 10, the fluorescence identification method S2 includes, as an example, steps S21 through S24. First, in the step S21, the fluorescence detection device 1 exposes the imaging device 14 and receives fluorescence. Next, in the step S22, the fluorescence detection device 1 converts, for each pixel, the amount of electric charge into an electric signal. Next, in the step S23, the fluorescence detection device 1 groups pixels having the same pattern of changes in the electric signal. Next, in step S24, the fluorescence detection device 1 obtains an image of a pixel group that changes in synchronization with a pattern in which the intensity of the fluorescence is changed. The above-described fluorescence identification method S2 makes it possible to identify the target light and the background light.

Note that the present embodiment has been described while the phosphor containing the NV center of the diamond is taken as an example of the phosphor. However, the phosphor that can be applied in the present embodiment is not limited to this phosphor. For example, the phosphor may be, other than the NV center of the diamond, an SiV center which contains a silicon atom that substitutes for a carbon atom and a vacancy defect that is adjacent to the silicon atom, a $V_{Si}V_C$ center of a silicon carbide crystal which $V_{Si}V_C$ center contains a vacancy defect that substitutes for a silicon atom and a vacancy defect that is adjacent to the vacancy defect, or a $V_{Si}$ center of a silicon carbide crystal which $V_{Si}$ center contains a vacancy defect that substitutes for a silicon atom.

(Measurement of Biological Sample)

The fluorescence detection device 1 in accordance with the present embodiment can be used to detect a complex of an antibody and a phosphor (an antibody-phosphor complex). This makes it possible to realize highly sensitive detection of an antigen to which the antibody specifically binds.

Further, an interaction that can be detected by the fluorescence detection device 1 is not limited to an antigen-antibody reaction. Examples of the interaction include an interaction between a ligand and a receptor, binding between a ligand and a protein having a binding domain, and a specific interaction between complementary strands in a nucleic acid and a nucleic acid-like low molecular weight compound. Further, it is possible to highly sensitively detect a protein-protein interaction, a protein-peptide interaction, a protein-low molecular weight compound interaction, a specific covalent binding reaction between proteins each having a sequence that covalently binds to a specific peptide sequence, each of which is conventionally known.

A detection target of the antibody is not particularly limited, and only needs to be an antigen to which the antibody specifically binds. Examples of the detection target include peptides, proteins, nucleic acids (such as DNA and RNA), sugars, and lipids. As the antibody, any of polyclonal antibodies, monoclonal antibodies, and fragments thereof (e.g., Fab, F(ab)2, and the like) can be used. Further, the class and the subclass of an immunoglobulin is not particularly limited. The antibody may be one that is selected from an antibody library by a phage display method or the like, or can be a conventionally-known antibody.

The kinds of ligands are not particularly limited, and examples of the ligands include, but are not limited to, proteins, peptides, amino acids, metal ions, low molecular weight substances, organic compounds, inorganic compounds, polysaccharides, nucleic acids, and lipids.

The fluorescence detection device 1 can also be used to detect a specific substance in a sample collected from a living body.

Examples of the sample collected from the living body include blood samples and spinal fluid (cerebrospinal fluid). The blood samples include whole blood, blood plasma, and blood serum. The blood samples are preferably blood plasma or blood serum, and more preferably blood plasma. Blood plasma can be separated from whole blood collected with a heparin salt (preferably sodium salt), a citrate (preferably sodium salt), or an ethylenediamine tetraacetic acid (EDTA) salt (preferably sodium salt or potassium salt). Blood plasma is more preferably blood plasma separated from whole blood collected with an EDTA salt or a heparin salt. The sample is not limited to these examples, provided that the sample is a living body-derived sample such as urine, perspiration, tears, cells, or tissue. A cell culture solution of a living body-derived cell, a cultured cell strain, or the like can also be the sample.

Examples of the living body include mammals, birds, reptiles, and amphibians. Among others, the mammals are preferable. Examples of the mammals include humans and non-human animals. The humans are preferable. Examples of the non-human animals include: domestic animals such as cattle, horses, pigs, and sheep; and pet animals and laboratory animals such as dogs, cats, rats, mice, hamsters, monkeys, and rabbits. Examples of the birds include poultry such as chickens, wild ducks, and domestic ducks.

Examples of the specific substance in the biological sample include: disease biomarkers that are known to be useful in identifying diseases; specific nucleic acid sequences; specific peptide sequences; and specific amino acid sequences. However, the specific substance is not limited to these examples.

The fluorescence detection device 1 can also be used for in vitro test and diagnosis of a target disease, by using a disease biomarker as a detection target.

Alternatively, the fluorescence detection device 1 can be used for in vitro test and diagnosis of a virus infection or the like by using, as a detection target, an antigen such as a nucleic acid sequence or the like derived from a virus, bacteria, or a microorganism.

Alternatively, it is also possible to detect a specific substance in a sample collected from an object other than a living body. For example, the fluorescence detection device 1 can be used for an environmental microorganism test by using, as a detection target, a microorganism or the like collected from an environment, food, water, soil, or the like.

The fluorescence detection device 1 can be used as an in vitro diagnostic device, and the fluorescence detection method can be used as an in vitro diagnostic method.

The fluorescence detection device 1 is capable of detecting a fluorescence-labeled nucleic acid. It is possible to detect amplification of a nucleic acid by detecting the amount of fluorescence incorporated in a complementary strand of the nucleic acid (DNA, RNA, or the like).

The fluorescence detection device 1 can be used as a nucleic acid amplification detection device, and the fluorescence detection method can be used as a nucleic acid amplification detection method.

Embodiment 2

The following description will discuss another embodiment of the present invention. Note that, for convenience, members having the same functions as those of the members described in the above embodiment are given respective identical reference numerals, and descriptions of those members are omitted.

Figure 3:
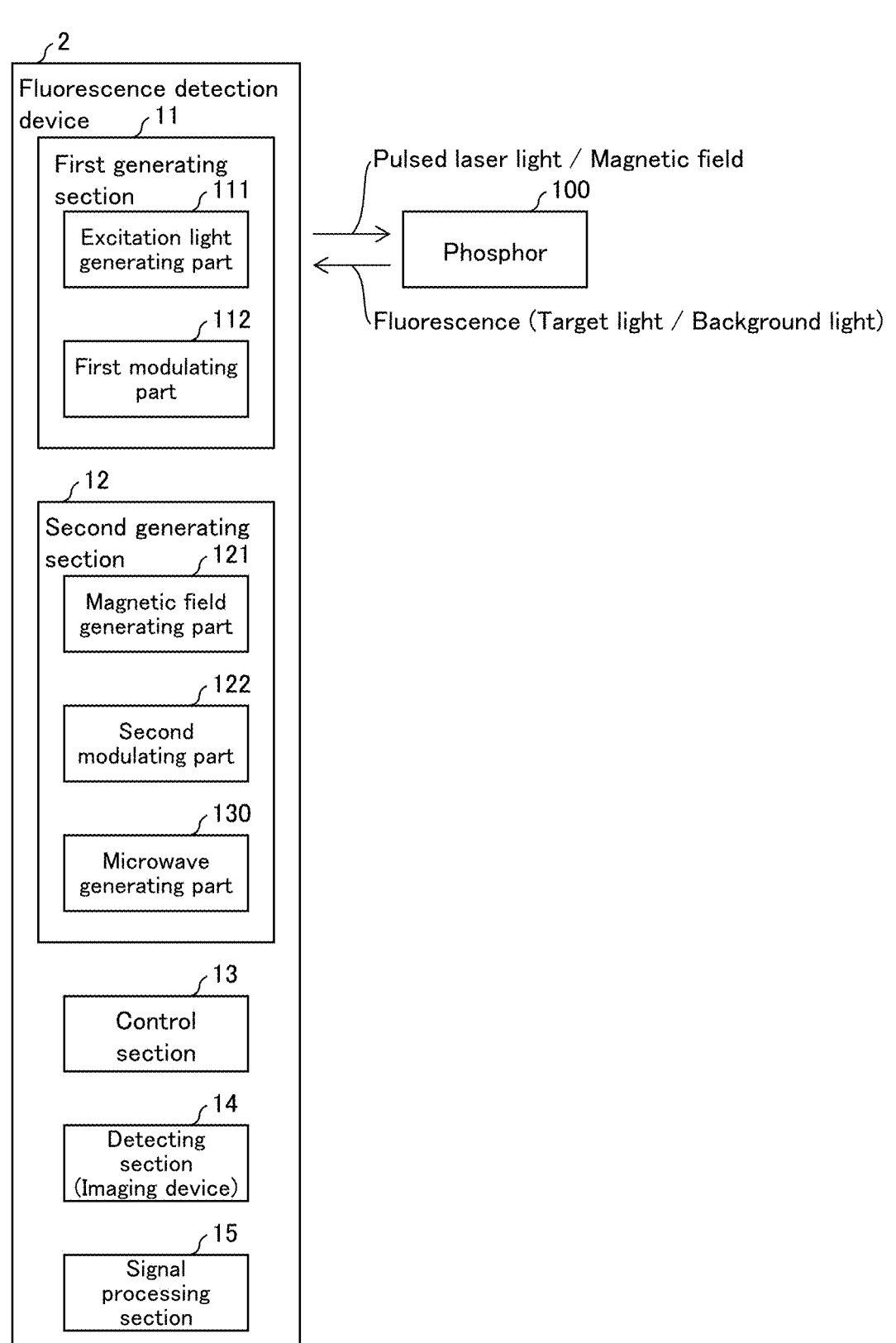
FIG. 3 is a block diagram illustrating a configuration of a fluorescence detection device 2 in accordance with Embodiment 2.

FIG. 3 is a block diagram illustrating a configuration of a fluorescence detection device 2 in accordance with Embodiment 2 of the present invention. As illustrated in FIG. 3, the fluorescence detection device 2 includes a first generating section 11, a second generating section 12, a control section 13, a detecting section 14, and a signal processing section 15. Note that the control section 13, the detecting section 14, and the signal processing section 15 are as described in Embodiment 1 and, therefore, descriptions thereof are omitted here.

The first generating section 11 includes an excitation light generating part 111 and a first modulating part 112. In the present embodiment, the excitation light generating part 111 is a laser oscillator that generates pulsed laser light having a wavelength which excites a phosphor 100. For example, in a case where the phosphor 100 is an NV center of a diamond, the wavelength of the pulsed laser light falls within, for example, a range of 495 nm to 570 nm and a range of 990 nm to 1140 nm which is twice that range.

The first modulating part 112 modulates the intensity of the pulsed laser light with use of a carrier wave having a first frequency and/or a first phase. Note that the frequency of the "first frequency" is a pulse frequency and is the number of ejections of pulses per unit time. By changing the pulse frequency, it is possible to change the intensity of the pulses (irradiation energy per unit time). A pulse width (time for which a pulse is ejected) is preferably a pulse width shorter than the reciprocal of "10 times the first frequency". The pulse width is more preferably a pulse width shorter than the reciprocal of "40 times the first frequency". The first generating section 11 irradiates the phosphor 100 with the pulsed laser light whose intensity is modulated. Each pulse may be continuous light, or may be pulsed light ejected intermittently.

A method in which the first modulating part 112 modulates the pulsed laser light includes, for example, internal modulation and external modulation. The internal modulation is a method of ejecting the pulsed laser light whose pulse frequency is modulated, by carrying out oscillation in a pulsed manner in the excitation light generating part (laser oscillator) 111. The external modulation is a method of converting laser light ejected as continuous light into pulsed light having a given pulse frequency (or pulse intensity) via an acousto-optic modulator (AOM), an electro-optic modulator (EOM), or the like.

The second generating section 12 includes a magnetic field generating part 121 and a second modulating part 122. The magnetic field generating part 121 generates a magnetic field for changing the intensity of target light. The magnetic field generating part 121 is, for example, an electromagnet or a permanent magnet. The magnetic field generating part 121 has a mechanism for modulating the intensity of the magnetic field with use of a carrier wave having the same frequency and/or phase as those/that of a received signal, by modulating an electric current applied to the electromagnet or modulating the distance between the magnet and a target object.

The second modulating part 122 modulates the intensity of the magnetic field with use of a carrier wave having a second frequency differing from the first frequency and/or a second phase differing from the first phase. The second modulating part 122 is, for example, a digital input/output device or an analog input/output device. The second modulating part 122 generates the signal with which the intensity of the magnetic field is modulated, and transmits the signal to the magnetic field generating part 121. The second generating section 12 irradiates the phosphor 100 with the magnetic field whose intensity is modulated.

Note that, in the case where the intensity of the target light from the phosphor 100 is changed with use of the magnetic field, it is necessary to irradiate the phosphor 100 with a stationary high-frequency magnetic field (a stationary radio wave, a stationary microwave, or the like) together. Therefore, the second generating section 12 includes a high-frequency magnetic field generating part (microwave generating part in the present embodiment) 130. The microwave generating part 130 is, for example, an analog signal generator, a vector signal generator, a voltage-controlled oscillator, or the like. In the following including the present embodiment, description will be given while a microwave is taken as an example of the high-frequency magnetic field.

Figure 4:
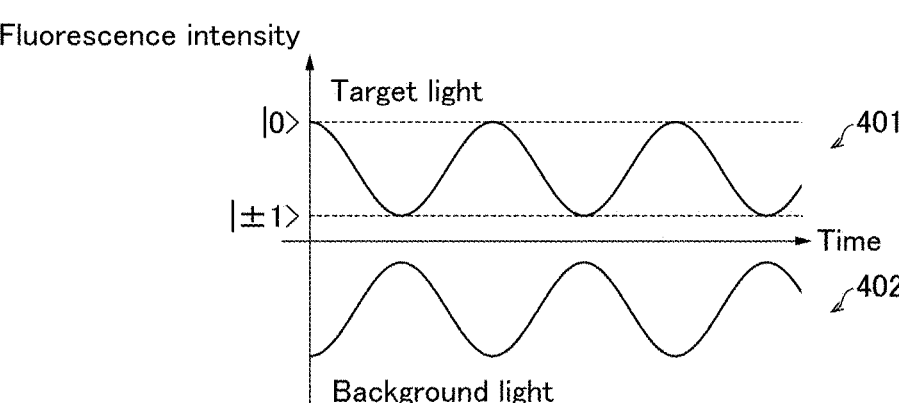
FIG. 4 illustrates (i) a relationship between the pulse frequency of pulsed laser light and the intensity of background light and (ii) a relationship between the intensity of a magnetic field and the intensity of target light, in Embodiment 2.
Figure 4:
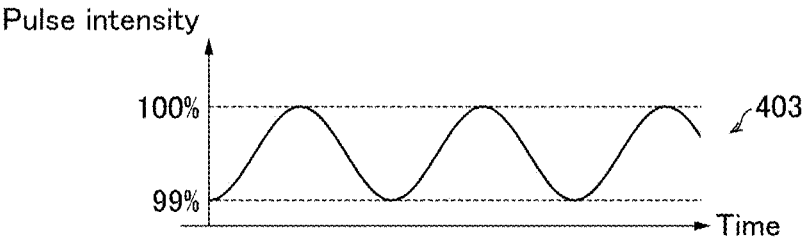
Figure 4:
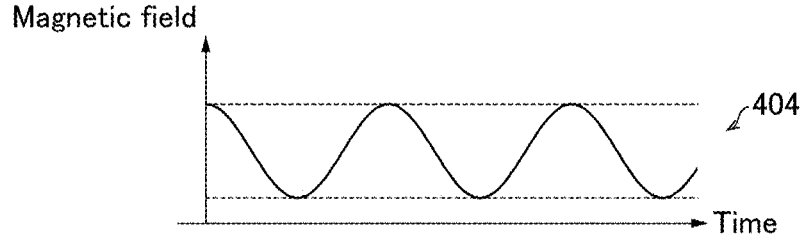
Figure 4:
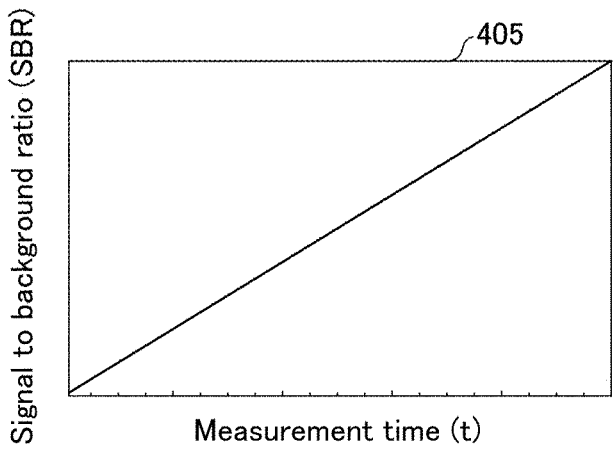

FIG. 4 illustrates (i) a relationship between the pulse intensity of the pulsed laser light and the intensity of background light and (ii) a relationship between the intensity of the magnetic field and the intensity of the target light, in the present embodiment. Specifically, 403 of FIG. 4 shows a pattern of changes in the pulse intensity of the pulsed laser light, and 404 of FIG. 4 shows a pattern of changes in the intensity of the magnetic field. As shown in FIG. 4, the first frequency is the same as the second frequency, but the first phase and the second phase are shifted 180 degrees from each other. Further, 402 of FIG. 4 shows changes in the intensity of the background light, and 401 of FIG. 4 shows changes in the intensity of the target light. Note that the amount of the shift between the first phase and the second phase does not need to be 180 degrees. However, in a case where the first frequency and the second frequency are the same, 180 degrees is an optimum condition, and, conversely, it is not preferable that the amount of the shift be +90 degrees or −90 degrees. Otherwise, the amount of the shift is not particularly limited. For example, it is particularly preferable that the amount of the shift be 180 degrees±45 degrees.

As shown in FIG. 4, a pattern of changes in the intensity of the target light is shifted 180 degrees from a pattern of changes in the intensity of the background light. It is found from this fact that fluorescence having a pattern of changes in intensity which pattern synchronizes with the pattern of changes in the intensity of the magnetic field is the target light and that fluorescence having a pattern of changes in intensity which pattern synchronizes with the pattern of changes in the pulse intensity of the pulsed laser light is the background light. The signal processing section 15 is capable of extracting the target light and the background light separately, by locking in and extracting g merely the fluorescence having such synchronizing patterns of changes.

Note that the modulation amplitude of the background light is smaller than the modulation amplitude of the fluorescence from the phosphor 100, the modulation amplitude of the background light being a change in the intensity of the background light which change is caused by the first modulating part 112 modulating the intensity, the modulation amplitude of the fluorescence from the phosphor 100 being a change in the intensity of the fluorescence from the phosphor 100 which change is caused by the second modulating part 122 modulating the intensity. This makes it possible to detect modulation of the intensity of the target light even in a case where modulation of the intensity of the background light occurs. Note, here, that the modulation amplitude of the background light is a difference between the maximum value and the minimum value of the change in the intensity of the background light shown in 402 of FIG. 4. Note also that the modulation amplitude of the fluorescence is a difference between the maximum value and the minimum value of the change in the intensity of the target light shown in 401 of FIG. 4.

In an example shown in 403 of FIG. 4, the pulse intensity of the pulsed laser light is changed so that the background light oscillates between 99% and 100% of the modulation amplitude of the fluorescence. That is, the pulse intensity is changed so that the intensity of the background light to be measured oscillates between 99% and 100% of the modulation amplitude of the fluorescence. At this time, the modulation amplitude of the background light is said to be 1%. This modulation amplitude of the background light does not need to be 1%, and only needs to be not more than 5%. The lower limit of the modulation amplitude of the background light may be approximately 0.01% or may be even lower. In a case where the lower limit exceeds 5%, an effect is reduced.

Further, as shown in 405 of FIG. 4, a signal to background ratio (SBR) obtained by measurement in the present embodiment is in proportion to a measurement time (t). In contrast, in the conventional technique in which only the target light (signal) is processed, the SBR is in proportion only to the square root of the measurement time (t) because there is no information about the background light (background). That is, it is meant that, in the measurement by the present embodiment, a higher SBR is obtained (detection accuracy is improved) in the same measurement time than in the conventional technique.

Note that, in the above embodiment, the frequency with which the pulse intensity is modulated is the same as the frequency with which the intensity of the magnetic field is modulated. However, the frequency with which the pulse intensity is modulated may differ from the frequency with which the intensity of the magnetic field is modulated. By identifying fluorescence having intensity that changes in synchronization with each of these frequencies, it is possible to identify the target light and the background light. Note, however, that a condition under the first frequency becomes the second frequency multiplied by an integer of 2 or more or a condition under which the second frequency becomes the first frequency multiplied by an integer of 2 or more should be avoided. Under the other conditions, the frequency with which the pulse intensity is modulated and the frequency with which the pulse frequency is modulated may be made different from each other, as appropriate.

As has been described, also in the fluorescence detection device 2 in accordance with Embodiment 2, it is possible to achieve the effect similar to that achieved in the fluorescence detection device 1 described in Embodiment 1.

(Modifications)

Note that, in the above embodiment, an example has been described in which the excitation light generating part 111 generates the pulsed laser light. However, the excitation light is not limited to pulsed light, and may be continuous light. Further, in the above embodiment, an example has been described in which the intensity is modulated by changing the pulse frequency. However, the above embodiment is not limited to this example, and the intensity may be modulated by changing the pulse amplitude.

Embodiment 3

The following description will discuss another embodiment of the present invention. Note that, for convenience, members having the same functions as those of the members described in the above embodiment are given respective identical reference numerals, and descriptions of those members are omitted.

Figure 5:
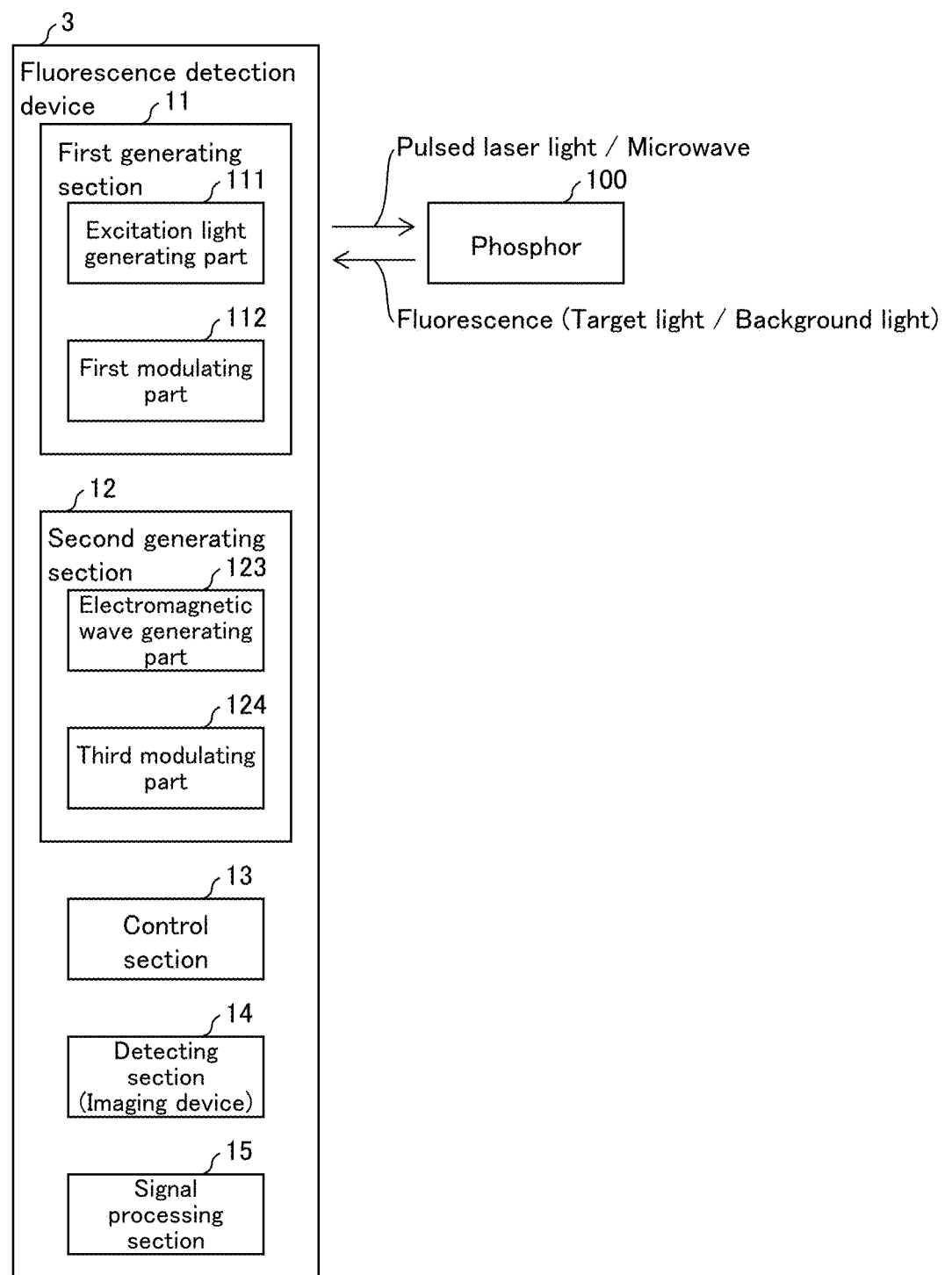
FIG. 5 is a block diagram illustrating a configuration of a fluorescence detection device 3 in accordance with Embodiment 3.

FIG. 5 is a block diagram illustrating a configuration of a fluorescence detection device 3 in accordance with Embodiment 3 of the present invention. As illustrated in FIG. 5, the fluorescence detection device 3 includes a first generating section 11, a second generating section 12, a control section 13, a detecting section 14, and a signal processing section 15. Note that the control section 13, the detecting section 14, and the signal processing section 15 are as described in Embodiment 1 and, therefore, descriptions thereof are omitted here.

The first generating section 11 includes an excitation light generating part 111 and a first modulating part 112 as in Embodiment 2, and a configuration thereof is as described in Embodiment 2. That is, the excitation light generating part 111 is a laser oscillator that generates pulsed laser light having a wavelength which excites a phosphor 100. The first modulating part 112 modulates the intensity of the pulsed laser light with use of a carrier wave having a first frequency and/or a first phase.

The second generating section 12 includes an electromagnetic wave generating part 123 and a third modulating part 124. The electromagnetic wave generating part 123 is a part that generates an electromagnetic wave for changing the intensity of target light, and is, in the present embodiment, a microwave oscillator that generates a microwave of 2.87 GHz.

The third modulating part 124 modulates the intensity of the microwave with use of a carrier wave having a second frequency differing from the first frequency and/or a second phase differing from the first phase. The third modulating part 124 is, for example, a high-frequency signal generating part. The third modulating part 124 generates a signal with which the intensity (amplitude) or the frequency of the microwave is modulated, and transmits the signal to the electromagnetic wave generating part 123. The second generating section 12 irradiates the phosphor 100 with the microwave whose intensity or frequency is modulated.

Figure 6:
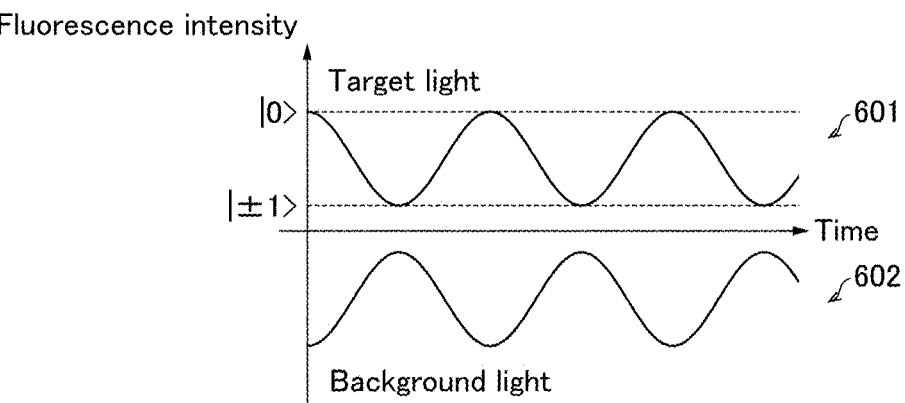
FIG. 6 illustrates (i) a relationship between the pulse frequency of pulsed laser light and the intensity of background light and (ii) a relationship between the intensity or the frequency of a microwave and the intensity of target light, in Embodiment 3.
Figure 6:
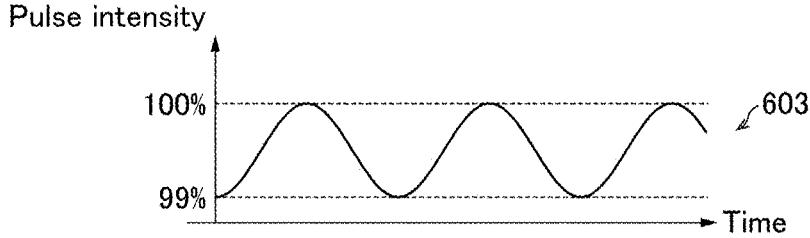
Figure 6:
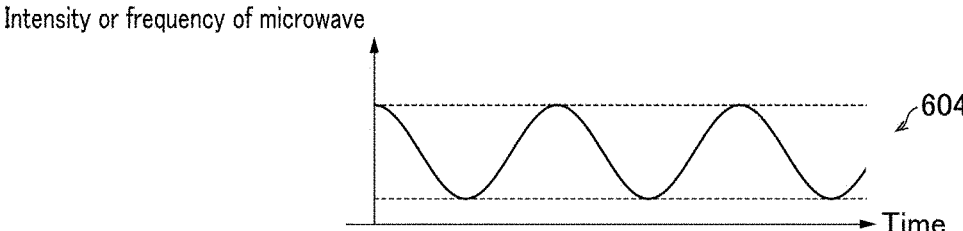

FIG. 6 illustrates (i) a relationship between the pulse frequency (pulse intensity) of the pulsed laser light and the intensity of background light and (ii) a relationship between the intensity or frequency of the microwave and the intensity of the target light, in the present embodiment. Specifically, 603 of FIG. 6 shows a pattern of changes in the pulse intensity of the pulsed laser light, and 604 of FIG. 6 shows a pattern of changes in the intensity or the frequency of the microwave. As shown in FIG. 6, the first frequency is the same as the second frequency, but the first phase and the second phase are shifted 180 degrees from each other.

Further, 602 of FIG. 6 shows changes in the intensity of the background light, and 601 of FIG. 6 shows changes in the intensity of the target light.

As shown in FIG. 6, a pattern of changes in the intensity of the target light is shifted 180 degrees from a pattern of changes in the intensity of the background light. It is found from this fact that fluorescence having a pattern of changes in intensity which pattern synchronizes with the pattern of changes in the intensity or the frequency of the microwave is the target light and that fluorescence having a pattern of changes in intensity which pattern synchronizes with the pattern of changes in the pulse intensity of the pulsed laser light is the background light. The signal processing section 15 is capable of extracting the target light and the background light separately, by locking in signals having such synchronizing patterns of changes.

Note that the modulation amplitude of the background light is smaller than the modulation amplitude of the fluorescence from the phosphor, the modulation amplitude of the background light being a change in the intensity of the background light which change is caused by the first modulating part 112 modulating the intensity, the modulation amplitude of the fluorescence from the phosphor being a change in the intensity of the fluorescence from the phosphor which change is caused by the third modulating part 124 modulating the intensity or the frequency. The meanings of the modulation amplitude of the background light and the modulation amplitude of the fluorescence are as described above. This makes it possible to detect modulation of the intensity of the target light even in a case where modulation of the intensity of the background light occurs. This modulation amplitude of the background light does not need to be 1%, and only needs to be not more than 5%. The lower limit of the modulation amplitude of the background light is approximately 0.01%.

Also in the present embodiment, a signal to background ratio (SBR) is in proportion to a measurement time (t), as described in Embodiment 2 Therefore, also in measurement by the present embodiment, a higher SBR is obtained in the same measurement time than in the conventional technique. That is, it is possible to improve detection accuracy.

The modifications described in Embodiment 2 can also be applied in the present embodiment.

Embodiment 4

The following description will discuss another embodiment of the present invention. Note that, for convenience, members having the same functions as those of the members described in the above embodiment are given respective identical reference numerals, and descriptions of those members are omitted.

Figure 7:
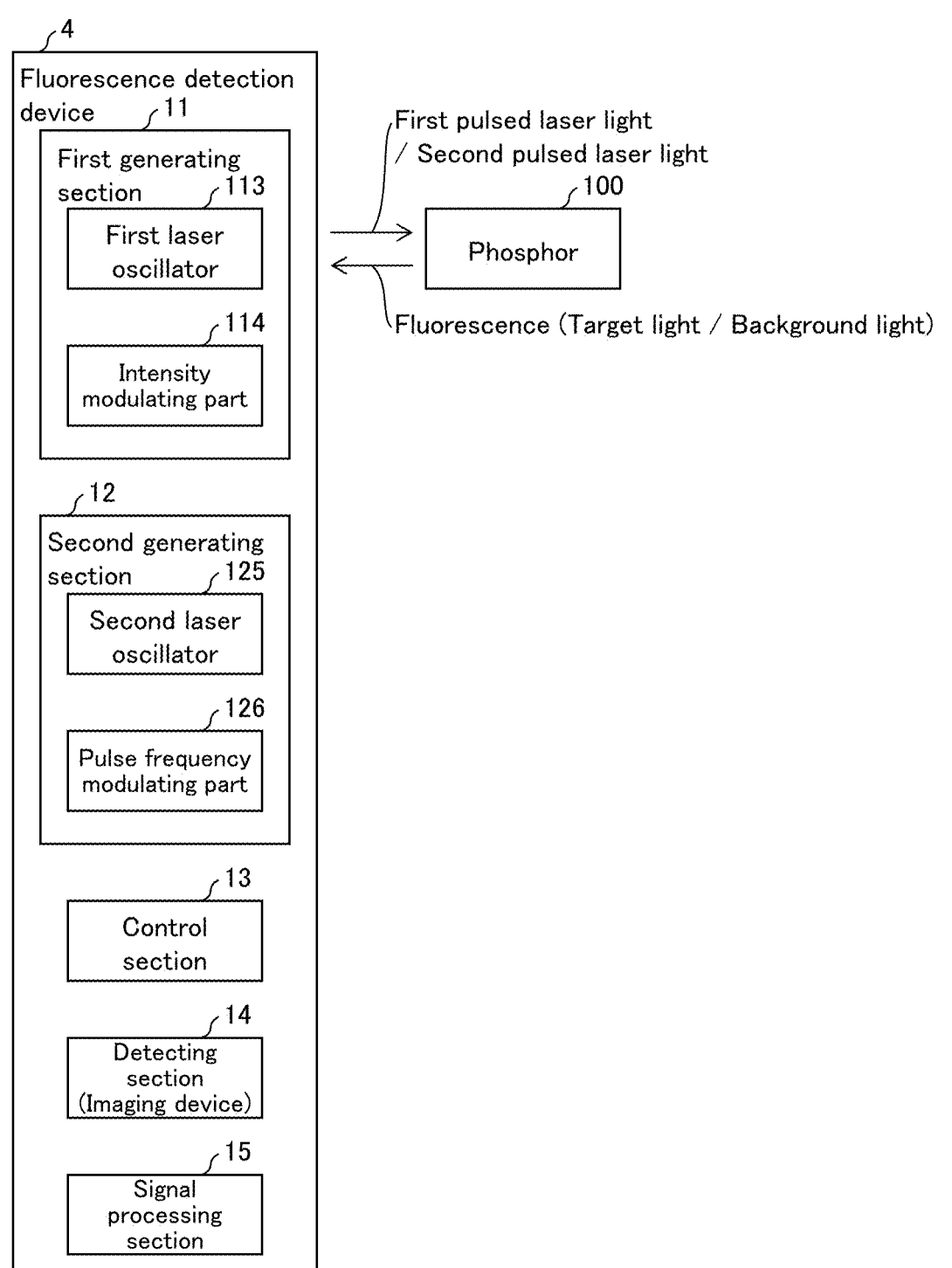
FIG. 7 is a block diagram illustrating a configuration of a fluorescence detection device 4 in accordance with Embodiment 4.

FIG. 7 is a block diagram illustrating a configuration of a fluorescence detection device 4 in accordance with Embodiment 4 of the present invention. As illustrated in FIG. 7, the fluorescence detection device 4 includes a first generating section 11, a second generating section 12, a control section 13, a detecting section 14, and a signal processing section 15. Note that the control section 13, the detecting section 14, and the signal processing section 15 are as described in Embodiment 1 and, therefore, descriptions thereof are omitted here.

The first generating section 11 includes a first laser oscillator 113 and an intensity modulating part 114. The first laser oscillator 113 is a laser oscillator that generates first pulsed laser light having a wavelength which excites phosphor 100. The intensity modulating part 114 modulates the intensity of the first pulsed laser light with use of a carrier wave having a first frequency and/or a first phase. The intensity modulating part 114 is, for example, a modulating signal generating part that generates a modulating signal for the intensity (amplitude) of laser pulse, and transmits the generated modulating signal to the first laser oscillator 113. The first generating section 11 irradiates the phosphor 100 with the first pulsed laser light whose intensity is modulated.

The second generating section 12 includes a second laser oscillator 125 and a pulse frequency modulating part 126. The second laser oscillator 125 generates second pulsed laser light for changing the intensity of target light. The pulse frequency modulating part 126 modulates the pulse frequency of the second pulsed laser light with use of a carrier wave having a second frequency differing from the first frequency and/or a second phase differing from the first phase. The pulse frequency modulating part 126 is, for example, a modulating signal generating part that generates a modulating signal for the pulse frequency of laser pulse, and transmits the generated modulating signal to the second laser oscillator 125. The second generating section 12 irradiates the phosphor 100 with the second pulsed laser light whose pulse frequency is modulated.

Figure 8:
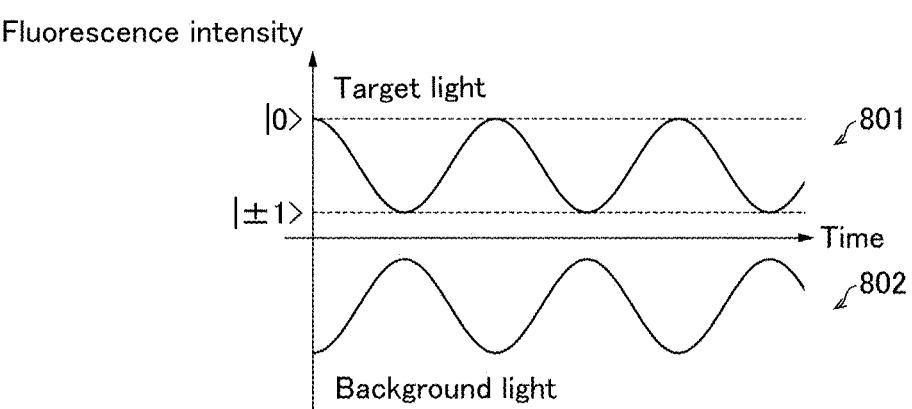
FIG. 8 illustrates (i) a relationship between the pulse intensity of first pulsed laser light that changes background light and the intensity of the background light and (ii) a relationship between the pulse frequency of second pulsed laser light that changes target light and the intensity of the target light, in Embodiment 4.
Figure 8:
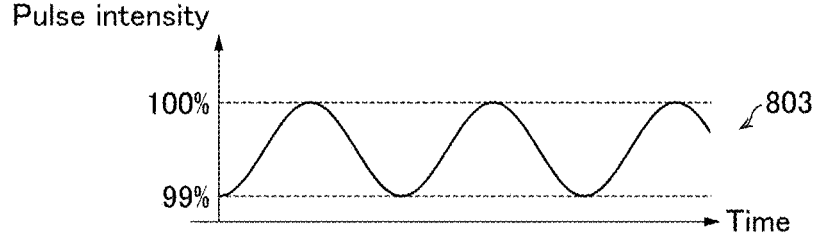
Figure 8:
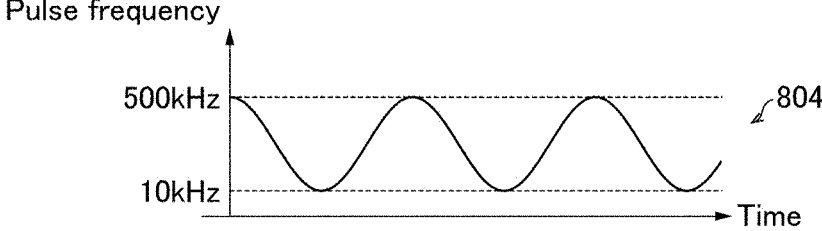

FIG. 8 illustrates (i) a relationship between the intensity (pulse intensity) of the first pulsed laser light that changes background light and the intensity of the background light and (ii) a relationship between the pulse frequency of the second pulsed laser light that changes the target light and the intensity of the target light, in the present embodiment. Specifically, 803 of FIG. 8 shows a pattern of changes in the pulse intensity of the first pulsed laser light, and 804 of FIG. 8 shows a pattern of changes in the pulse frequency of the second pulsed laser light. As is clear from these, the frequency of the first pulsed laser light is the same as the frequency of the second pulsed laser light, but the first phase and the second phase are shifted 180 degrees from each other. Further, 802 of FIG. 8 shows changes in the intensity of the background light, and 801 of FIG. 8 shows changes in the intensity of the target light.

As shown in 801 of FIG. 8, a pattern of changes in the intensity of the target light is shifted 180 degrees from a pattern of changes in the intensity of the background light. It is found from this fact that fluorescence having a pattern of changes in intensity which pattern synchronizes with the pattern of changes in the pulse intensity of the first pulsed laser light is the background light and that fluorescence having a pattern of changes in intensity which pattern synchronizes with the pattern of changes in the pulse frequency of the second pulsed laser light is the target light. The signal processing section 15 is capable of extracting the target light and the background light separately, by locking in signals having such synchronizing patterns of changes.

Note that, in an example shown in 804 of FIG. 8, the pulse frequency is changed between 10 kHz and 500 kHz. However, a modulation range of the pulse frequency is not limited to this example. For example, the modulation range of the pulse frequency may be a range between 100 Hz and 200 MHZ, preferably a range between 1 kHz and 1000 kHz, and more preferably a range between 10 kHz and 500 kHz. By modulating the pulse frequency in such a range, it is possible to carry out measurement with improved accuracy. In a case where the modulated pulse frequency falls below 100 Hz, a measurement time becomes long and time resolution decreases. Therefore, this is not preferable.

Also in the present embodiment, a relationship between the modulation amplitude of the background light and the modulation amplitude of the fluorescence is as described in Embodiments 2 and 3. The modifications described in Embodiment 2 can also be applied in the present embodiment.

Also in the present embodiment, a signal to background ratio (SBR) is in proportion to a measurement time (t), as described in Embodiment 2 Therefore, also in measurement by the present embodiment, a higher SBR is obtained in the same measurement time than in the conventional technique. That is, it is possible to improve detection accuracy. Further, in the present embodiment, the first laser oscillator 113 is used to change the intensity of the background light, and the second laser oscillator 125 is used to change the intensity of the target light. A laser oscillator is small in device configuration and inexpensive as compared with a magnetic field generating device or a microwave generating device. Therefore, it is possible to identify the target light with an inexpensive and compact device configuration, as compared with the conventional technique.

Embodiment 5

The following description will discuss another embodiment of the present invention. Note that, for convenience, members having the same functions as those of the members described in the above embodiment are given respective identical reference numerals, and descriptions of those members are omitted.

Figure 9:
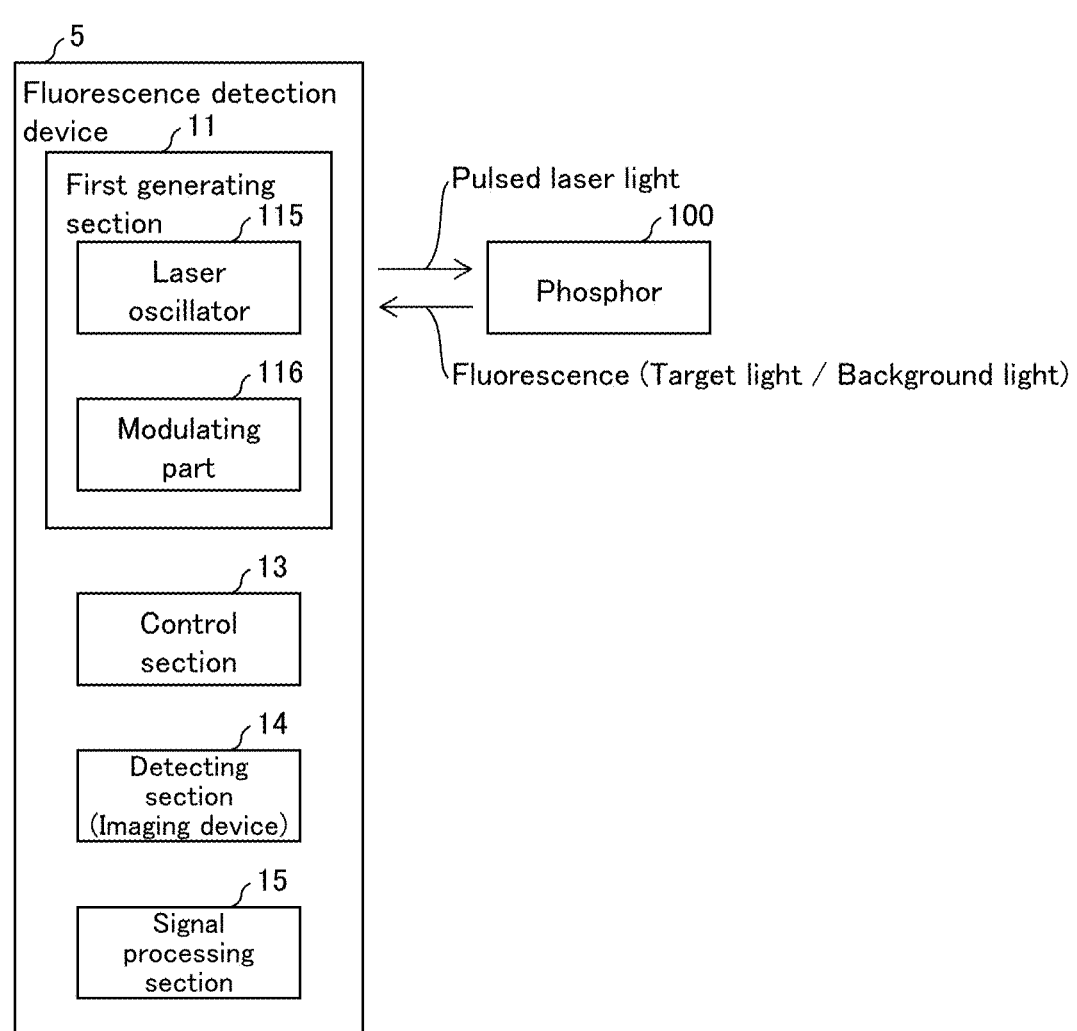
FIG. 9 is a block diagram illustrating a configuration of a fluorescence detection device 5 in accordance with Embodiment 5.

FIG. 9 is a block diagram illustrating a configuration of a fluorescence detection device 5 in accordance with Embodiment 5 of the present invention. As illustrated in FIG. 9, the fluorescence detection device 5 includes a first generating section 11, a control section 13, a detecting section 14, and a signal processing section 15. Note that the control section 13, the detecting section 14, and the signal processing section 15 are as described in Embodiment 1 and, therefore, descriptions thereof are omitted here.

The first generating section 11 includes a laser oscillator 115 and a modulating part 116. The first generating section 11 has both functions of the first generating section 11 and the second generating section 12 described in Embodiment 4. Specifically, the laser oscillator 115 is a laser oscillator that generates pulsed laser light. The laser oscillator 115 generates (pulsed) laser light having a wavelength which excites a phosphor 100. The modulating part 116 modulates the pulses of the laser light generated by the laser oscillator 115, by internal modulation or external modulation.

More specifically, the first modulating part 116 modulates the intensity of the pulsed laser light with use of a carrier wave having a first frequency and/or a first phase. That is, the first modulating part 116 modulates the pulse intensity (amplitude) of the pulsed laser light. Furthermore, the modulating part 116 modulates the pulse frequency of the pulsed laser light with use of a carrier wave having a second frequency differing from the first frequency and/or a second phase differing from the first phase. That is, the modulating part 116 modulates the frequency (the number of pulses per time) of the pulses whose pulse intensity is modulated. In this manner, the modulating part 116 modulates the intensity (amplitude) and the frequency of the pulses in parallel.

In the present embodiment, a relationship between the pulse intensity of the pulsed laser light that changes background light and the intensity of the background light and a relationship between the pulse frequency of the pulsed laser light that changes target light and the intensity of the target light are the same as those indicated by a graph shown in FIG. 8.

Note that, in the above embodiment, it has been described that the modulating part 116 is configured to modulate the intensity of the pulsed laser light with use of the carrier wave having the first frequency and/or the first phase and modulate the pulse frequency of the pulsed laser light with use of the carrier wave having the second frequency differing from the first frequency and/or the second phase differing from the first phase. However, the modulating part 116 is not limited to such a configuration. For example, the modulating part 116 may be configured to include an intensity modulating part that modulates the intensity of the pulsed laser light with use of the carrier wave having the first frequency and/or the first phase and a pulse frequency modulating part that modulates the pulse frequency of the pulsed laser light with use of the carrier wave having the second frequency differing from the first frequency and/or the second phase differing from the first phase (not illustrated). The modifications described in Embodiment 2 can also be applied in the present embodiment.

In the fluorescence detection device 5 in accordance with the present embodiment, it is possible to change the intensity of the target light and the intensity of the background light in parallel with use of a single laser oscillating device and a single modulating part, and possible to identify the target light and the background light. Therefore, an effect that it is possible to improve measurement accuracy and a device configuration becomes extremely simple is brought about, as compared with the conventional technique.

The present invention is not limited to the embodiments, but can be altered by a skilled person in the art within the scope of the claims. The present invention also encompasses, in its technical scope, any embodiment derived by combining technical means disclosed in differing embodiments.

Example 1

Example 1 of the present invention will be described below with reference to FIGS. 11 to 13. A demonstration experiment was carried out by applying the present technique to an in vitro sample that had been obtained by adsorbing fluorescent nanodiamonds on a coverslip stained with rhodamine-phalloidin (hereinafter referred to as rhodamine). Rhodamine is generally used for intracellular labeling of cytoskeletal actin. Rhodamine emits fluorescence in a wavelength range of 550 nm to 700 nm after being excited by green light. Therefore, even under a measurement condition at a time when a fluorescent nanodiamond is observed, intense fluorescence from rhodamine is observed (a part of 1101 of FIG. 11 which part is enclosed by a dotted-line circle, a part which is enclosed by a solid-line circle indicates fluorescence from an NV center).

With use of a CCD camera, exposure was carried out for 100 ms per frame. The exposure and irradiation with pulsed laser light were synchronized such that, during the exposure, irradiation with the pulsed laser light was carried out at 950 pulses/frame and at ejection intervals of 100 μs in each odd-numbered frame and at ejection intervals of 2 μs in each even-numbered frame. The total irradiation intensity in the even-numbered frames was approximately 99% of the total irradiation intensity in the odd-numbered frames.

Figure 11:
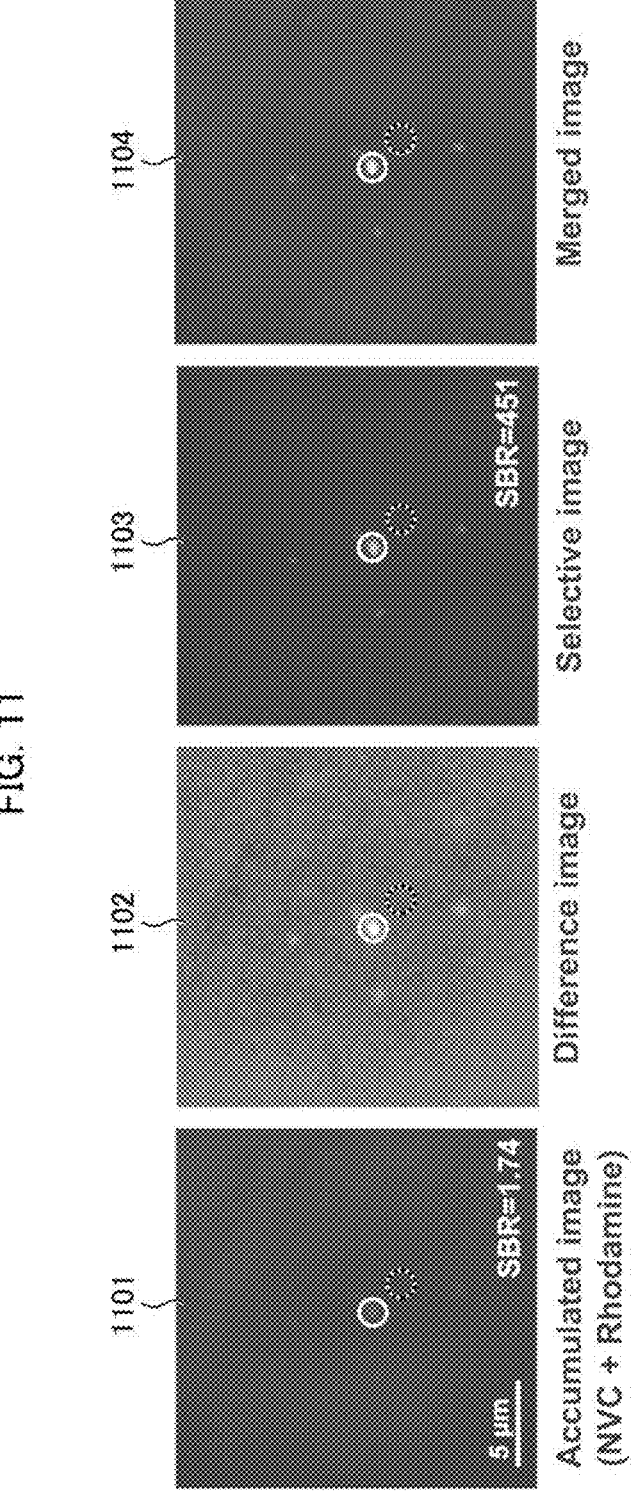
FIG. 11 shows a captured image of an in vitro sample and images obtained by processing the captured image, in accordance with Example 1.
Figure 12:
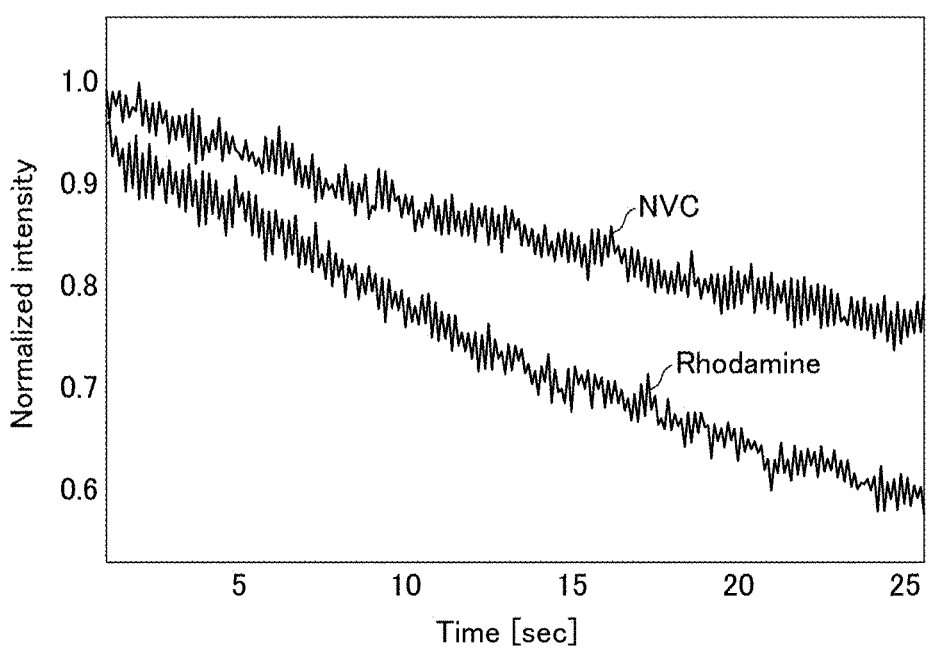
FIG. 12 is a graph showing changes in fluorescence intensity derived from a NVC and rhodamine in the in vitro sample, in accordance with Example 1.
Figure 13:
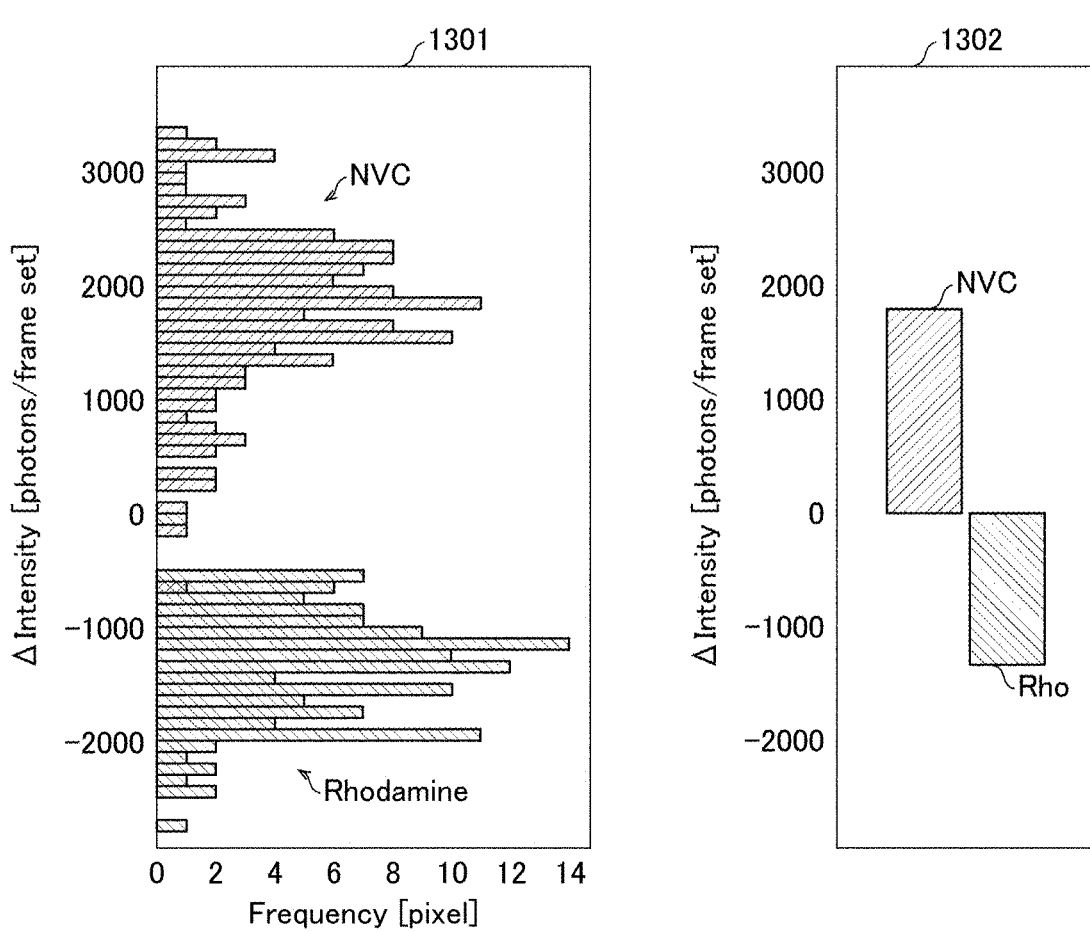
FIG. 13 is a differential intensity distribution of a difference image obtained from an even-numbered frame and an odd-numbered frame of the in vitro sample, in accordance with Example 1.

As a result, fluorescence intensity derived from NVCs and fluorescence intensity derived from the rhodamine varied in the same period and in opposite phase (FIG. 12). A difference image obtained from the even-numbered frame and the odd-numbered frame (1102 in FIG. 11) showed a differential intensity distribution similar to that in a simulation (1301 of FIG. 13). A difference between a distribution attributed to the NVCs and a distribution attributed to the rhodamine was statistically significant (1302 of FIG. 13). By thresholding the difference image at 0, fluorescence from the rhodamine was eliminated, and a selective image of the fluorescent nanodiamonds was obtained (1103 of FIG. 11). Note that it was confirmed, also by ODMR frequency spectra, that these bright spots indicated the fluorescent nanodiamonds.

Furthermore, typical signal to background ratios (SBRs) obtained in the experiment were evaluated by comparing fluorescence intensity derived from a fluorescent nanodiamond with fluorescence intensity derived from a rhodamine background (solid-line circles and dotted-line circles in 1101 to 1104 of FIG. 11). The SBR of an accumulated image made up of 256 frames was 1.74 (1101 of FIG. 11), whereas the SBR of the selective image obtained from the same image set was improved to 451 (1103 of FIG. 11).

Example 2

Example 2 of the present invention will be described below. Example 2 shows a result of an experiment in which a cultured cell was used. The biological applicability of the present technique was verified by obtaining a selective image of fluorescent nanodiamonds that had been introduced into a living cell stained with a fluorescent dye (FIG. 14).

The fluorescent nanodiamonds were introduced into a HeLa cell (1401 of FIG. 14) by endocytosis. The HeLa cell was stained with a JC-1 fluorescent dye. Then, the present technique was applied. JC-1 is widely used to detect a mitochondrial membrane potential that is an index of a mitochondrial health state associated with apoptosis and necrosis. Mitochondria, on the other hand, have recently become important measurement targets in quantum sensing in which NVCs are used. However, a hem of a fluorescence emission spectrum ($\lambda_{em}$=590) of JC-1 slightly overlaps with a hem of an NVC. Background light caused by this overlapping of the spectra adversely affects detection of a fluorescent nanodiamond in fluorescence imaging (1402 of FIG. 14).

Figure 14:
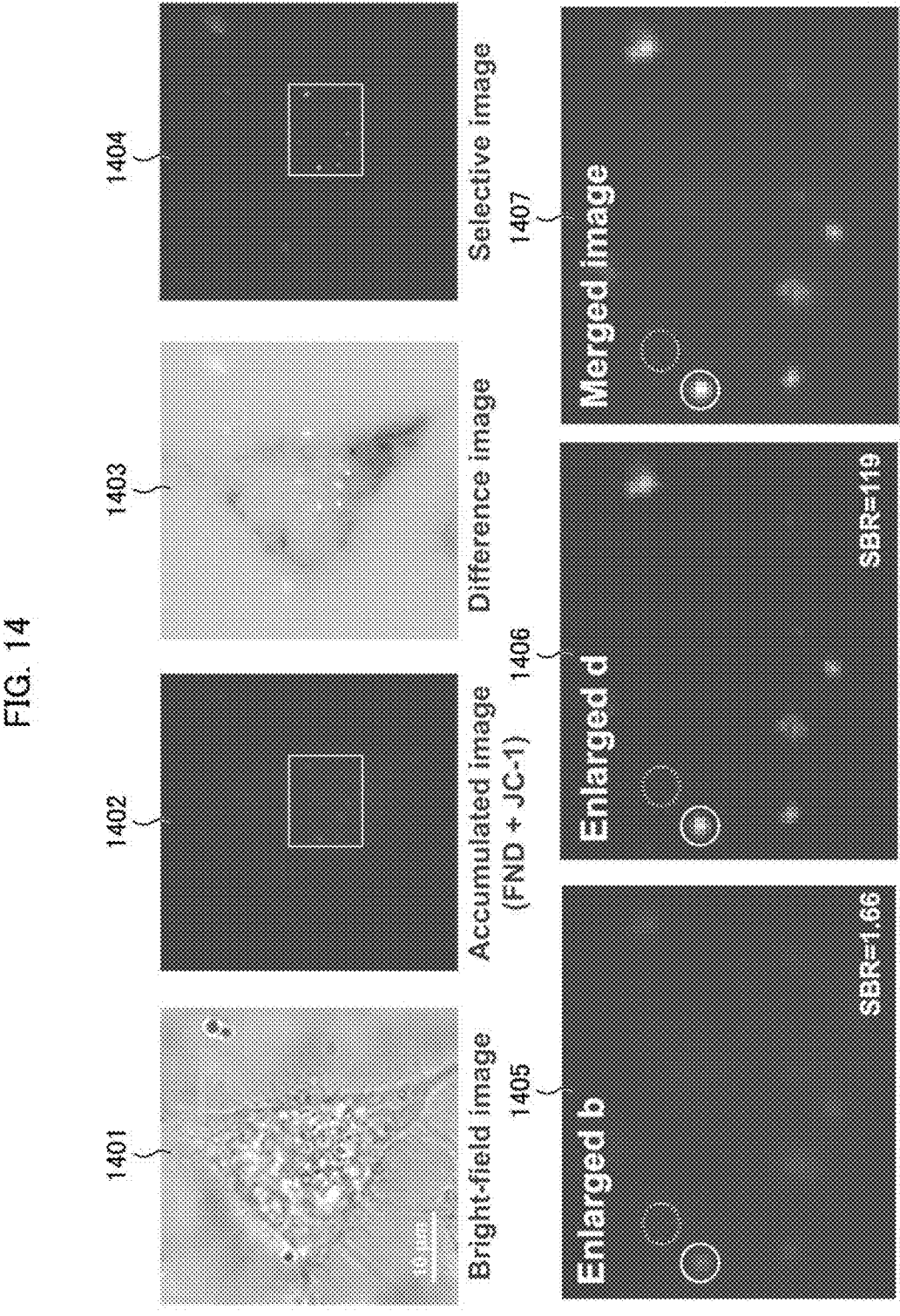
FIG. 14 shows images obtained in a case where fluorescent nanodiamonds were introduced into a HeLa cell stained with a JC-1 fluorescent dye, in accordance with Example 2.

However, it was found that, by using the present technique, a clearer selective image of a fluorescent nanodiamond in a living cell was obtained (1403 and 1404 of FIG. 14). Typical SBRs were evaluated between (i) a fluorescent nanodiamond indicated by a solid-line circle in 1405 of FIG. 14 and (ii) a JC-1 background indicated by a dotted-line circle in 1405 of FIG. 14. The SBRs of an accumulated image and the selective image each obtained from 256 frames (1402 and 1403 of FIG. 14) were respectively 1.66 and 119 (1405 and 1406 of FIG. 14). By applying the present technique, background light (derived from JC-1) was eliminated also in the living cell, and also the SBR was improved not less than 50 times.

Example 3

Example 3 of the present invention will be described below. Biological samples often exhibit particulate autofluorescence caused by intrinsic and extrinsic fluorescent granules. Therefore, the present method is particularly useful in quantitative measurement of an in vivo microenvironment in which measurement a nanodiamond is used as a quantum sensor. For example, *C. elegans* (1501 of FIG. 15) emits intense red particulate autofluorescence, which is referred to as "age pigment" (1502 of FIG. 15). The presence of such particulate autofluorescence makes it extremely difficult to locate a fluorescent nanodiamond that has been introduced into *C. elegans* in an attempt to, for example, measure a temperature.

Figure 15:
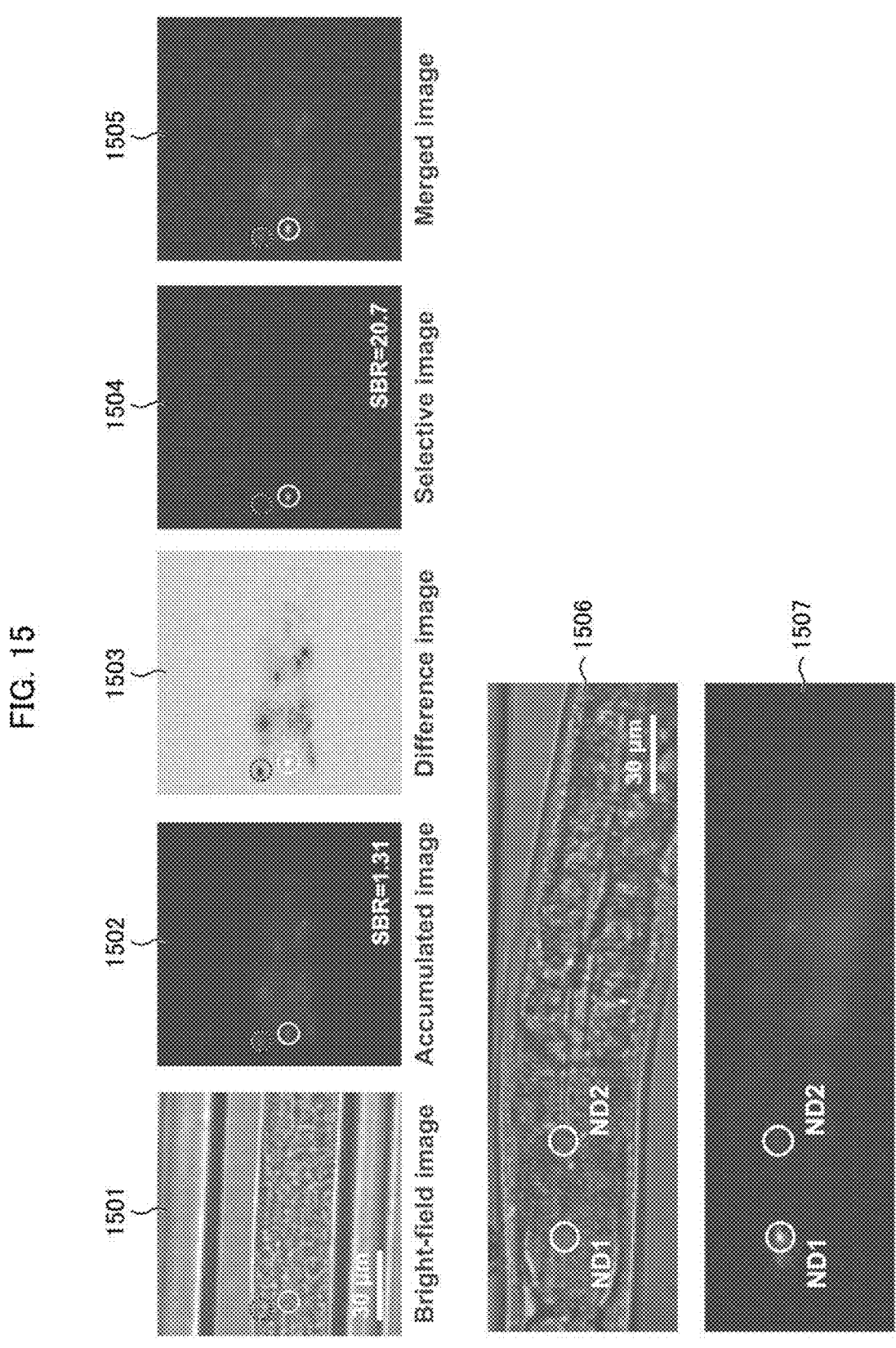
FIG. 15 shows images obtained in a case where fluorescent nanodiamonds were introduced into *C. elegans*, in accordance with Example 3.

However, when the present method was used, it was possible to easily distinguish between fluorescent nanodiamonds and particulate autofluorescence (1503 to 1505 and 1507 of FIG. 15). Typical SBRs were evaluated between (i) a fluorescent nanodiamond indicated by solid-line circles in 1501 to 1505 of FIG. 15 and (ii) particulate autofluorescence indicated by dotted-line circles in 1501 to 1505 of FIG. 15. The SBRs of an accumulated image and a selective image each made up of 256 frames were respectively 1.31 and 20.7 (1502 and 1504 of FIG. 15).

Figure 16:
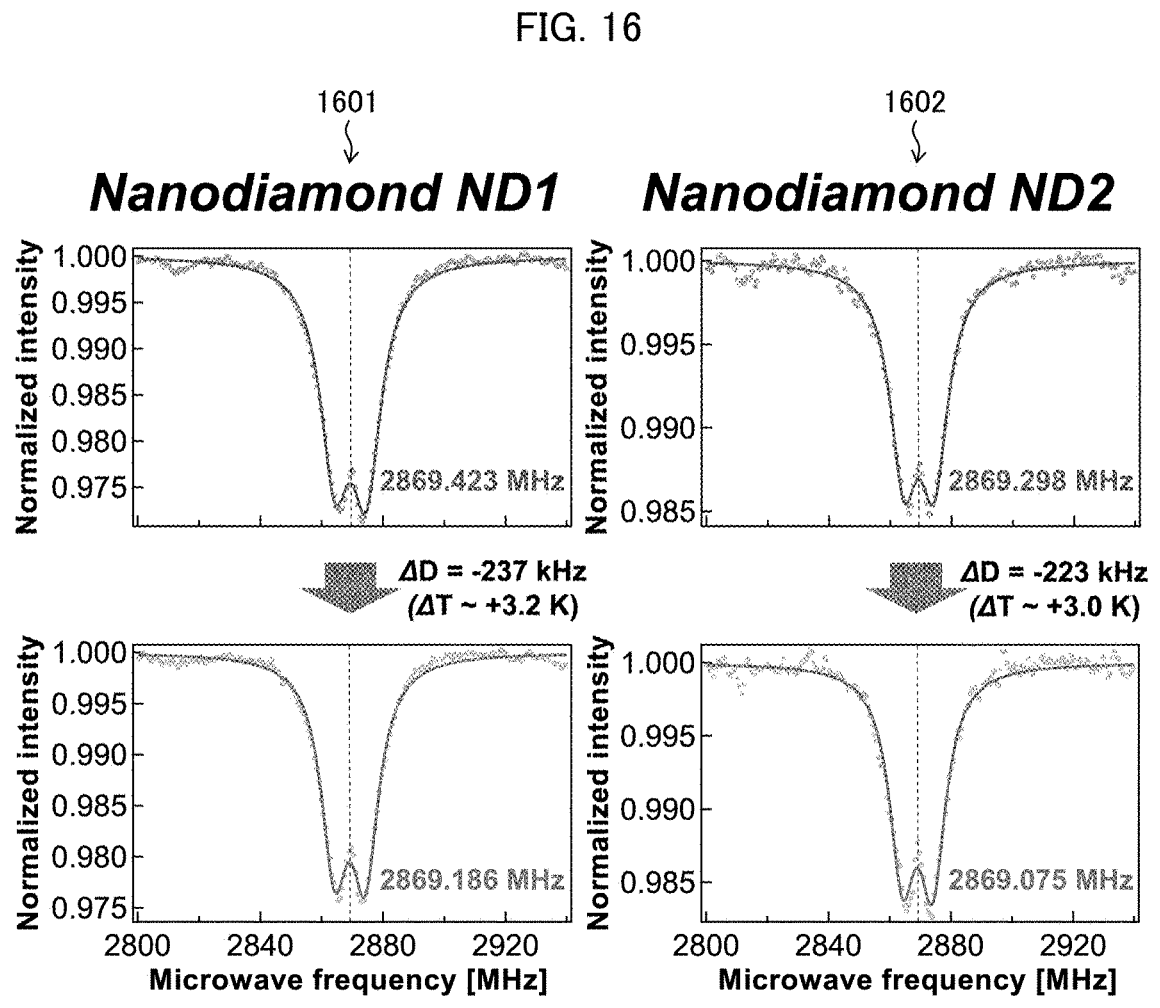

In addition, changes in the temperature of living *C. elegans* were also measured with use of fluorescent nanodiamonds that had been located by the present technique. In order to change the temperature of the sample, a heater was placed close to the *C. elegans* sample. With use of ODMR of two fluorescent nanodiamonds that existed relatively close to each other (ND1 and ND2; 1506 and 1507 of FIG. 15), changes in the temperatures of ND1 and ND2 between before and after external heating were simultaneously evaluated. Zero-field splitting widths D obtained by ODMR frequency spectra changed as the temperature of the sample increased (FIG. 16). As shown in 1601 and 1602 of FIG. 16, changes in D in ND1 and ND2 were respectively −237±96 kHz and −223±144 kHz, which respectively corresponded to changes in the temperatures of 3.2±1.3 K and 3.0±1.9 K. As expected, values of changes in two temperatures were relatively similar.

In conventional in vivo measurement in which a fluorescence nanodiamond is used as a quantitative sensor, it is difficult to find the nanodiamond buried in autofluorescence. Thus, much time has been spent. The newly proposed present technique will be a powerful tool in bio-application of a fluorescent nanodiamond.

Example 4

Example 4 of the present invention will be described below. In Example 4, it was demonstrated that the present technique was effective also for a sample of a higher eukaryote, by observing fluorescence nanodiamonds on an ex vivo hippocampus slice obtained from a rat (1701 of FIG. 17).

Before the observation, it was confirmed, with use of a microelectrode array system, that potentials were evoked after electrical stimulation, in order to prove that this hippocampus slice sample was alive. As a result, evoked potentials shown in 1705 of FIG. 17 were observed at a position of a region of interest (a rectangle ahead of an arrow) shown in 1701 of FIG. 17. When the fluorescent nanodiamonds were observed at this position, images with a lower background and higher contrast than those of an accumulated image (1702 of FIG. 17) were obtained by the present technique (1703 and 1704 of FIG. 17), though the hippocampus slice that had been washed well showed extremely low autofluorescence.

Figure 17:
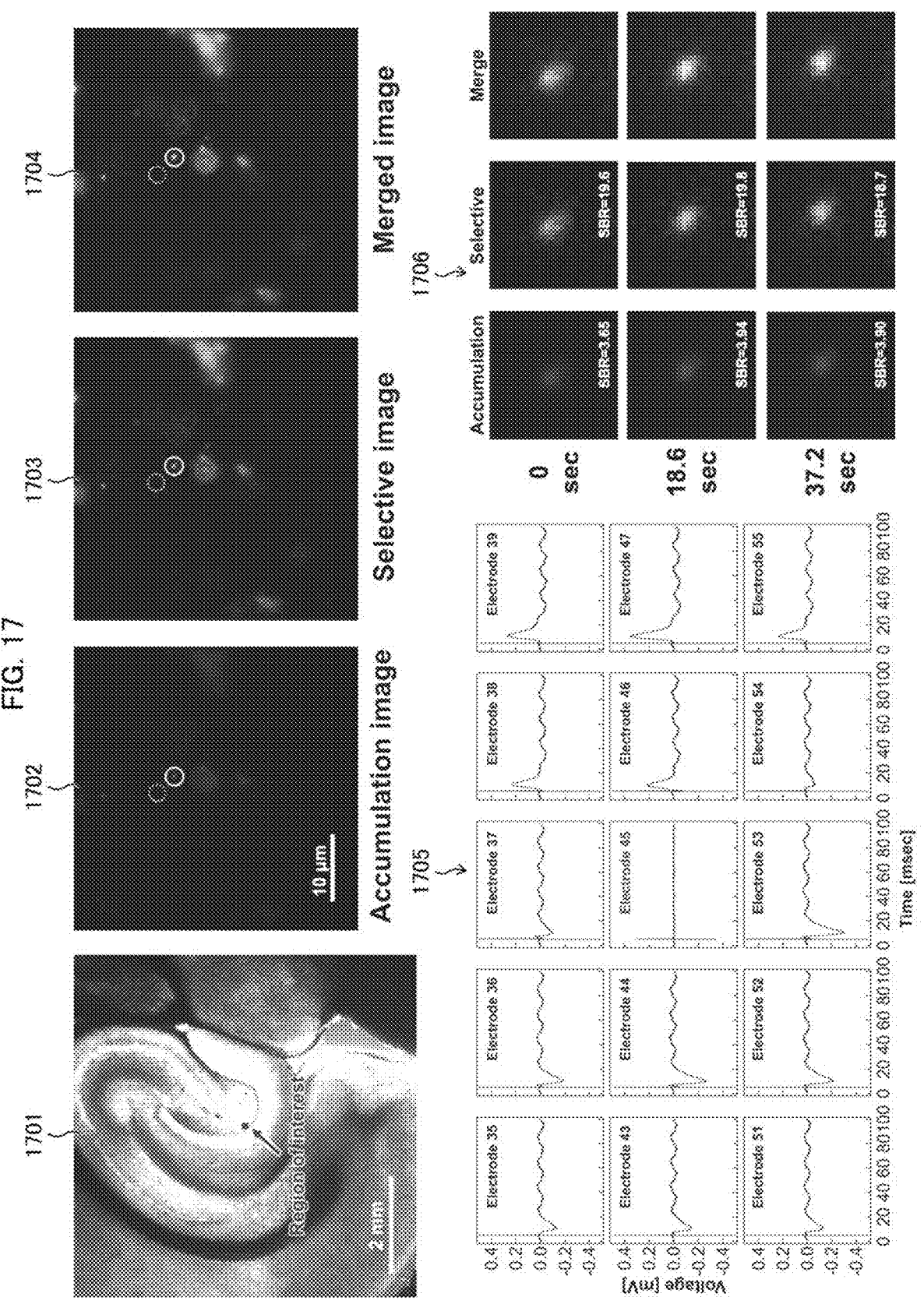
FIG. 17 shows images and evoked potentials obtained in a case where fluorescent nanodiamonds were introduced into an ex vivo hippocampus slice, in accordance with Example 4.

In addition, the selective image was reconstructed as a moving image by creating moving average images by sliding window of 64 frames to 256 frames (1706 of FIG. 17). As a result, translational motions similar to those seen in a moving image of the accumulated image which moving image was created by similar sliding window were observed with a lower background. SBRs were evaluated. As a result, the SBR of the accumulated image in which 256 frames were used was an average of 3.90, whereas the SBR of the selective image in which the same 256 frames were used was an average of 19.3 (1706 of FIG. 17).

A neural circuit of a brain is an important measurement target for an NVC. A cultured hippocampus of a rat is one of the simplest and most controllable experimental model systems for neural circuits in the brains of mammals. Potentials evoked after electrical stimulation, as shown in 1705 of FIG. 17, are generally used for measurement of a neural circuit. However, this method, which relies solely on potentials, is limited only to neural activities in which information to be obtained relates to potentials. Therefore, desired are techniques experimental which provide information about physical and chemical parameters relating to brain cells including glia cells. In particular, the importance of a relationship between a brain function and the pH of a microenvironment begins to attract attention. In recent years, a fluorescent nanodiamond is also expanding its application range also to measurement of not only a temperature and a magnetic field but also a pH. It is considered that measurement of the physical and chemical parameters of a neural circuit of a brain can be carried out with use of a fluorescent nanodiamond. In particular, it is considered that the present technique demonstrates its performance in a case where a recombinant mouse in which a fluorescent protein is expressed is used.

Example 5

Example 5 of the present invention will be described below with reference to FIGS. 18 to 20. Fluorescent nanodiamonds (particle diameter: 200 nm) were adsorbed on a cover glass, and pulse-irradiated with a green laser having a wavelength of 532 nm as an excitation light source. Further, fluorescence from the fluorescent nanodiamonds (target light) was modulated with use of a microwave (2870 MHz). At this time, the fluorescent nanodiamonds were irradiated with the microwave only in odd-numbered frames, and were not irradiated with the microwave in even-numbered frames. The intensity of the microwave at the time of irradiation was set to 1 W. Further, the intensity of the green laser was modulated by adjusting the number of pulses so that the intensity in the even-numbered frames was 99% of the intensity in the odd-numbered frames. The intensity of the green laser in the odd-numbered frames was set to 100 mW.

Under the above conditions, the fluorescence from the fluorescent nanodiamonds (target light) and fluorescence from an object other than the fluorescent nanodiamonds (background light) were collected with use of a 20× objective lens, and a fluorescence image obtained through a long pass filter that transmitted light having a wavelength of not less than 650 nm was captured as a moving image with use of an electron multiplier type CCD camera. The moving image was captured by capturing 10 frames per second and capturing frames for 100 seconds to obtain 1000 frames.

Figure 18:
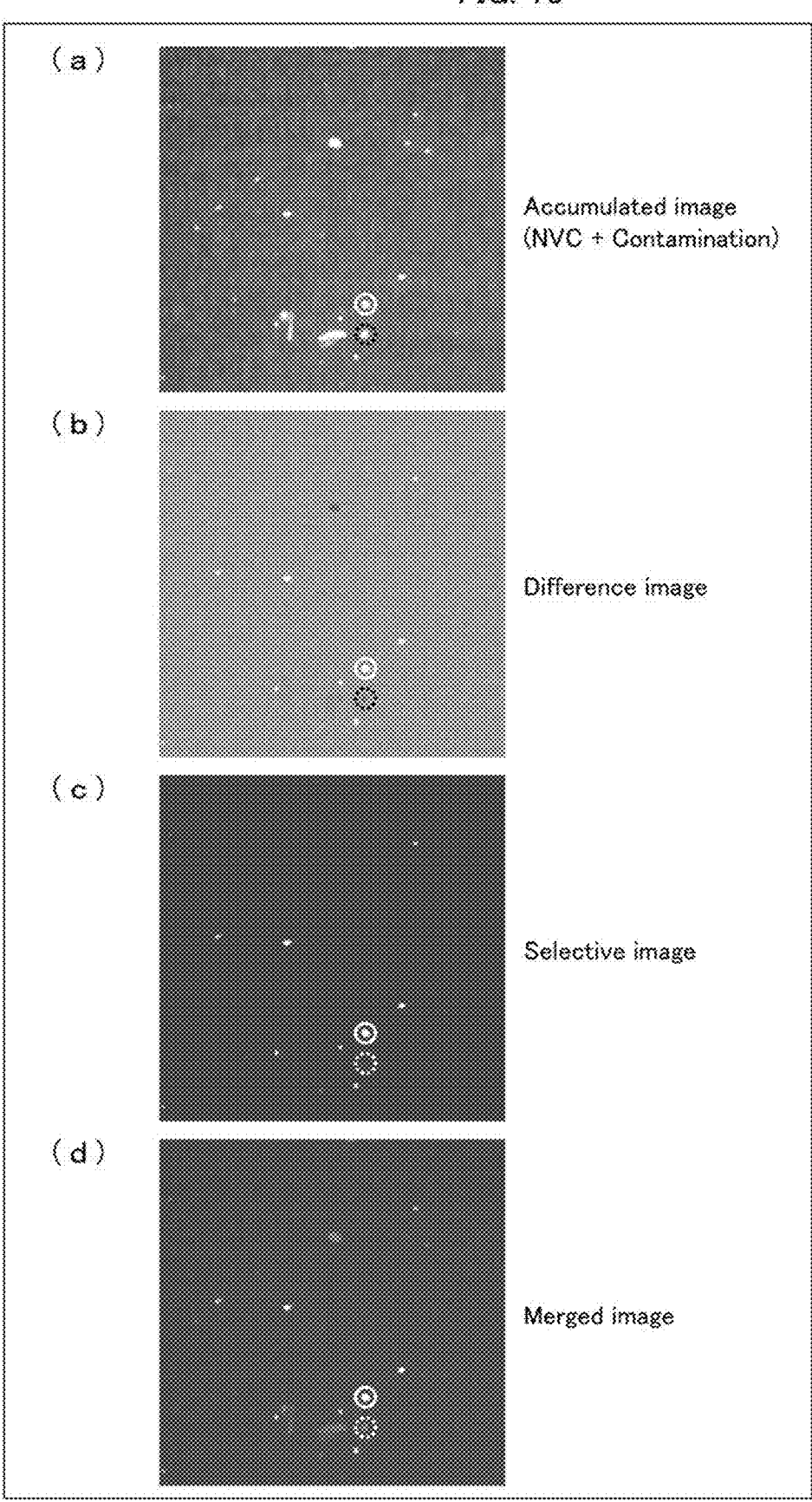
FIG. 18 shows fluorescence images obtained in Example 5 and processed.

FIG. 18 shows a result of processing the captured image. (a) of FIG. 18 is an accumulated image of all frames. In (a) of FIG. 18, the target light and the background light are imaged in the same manner, and thus it is not possible to distinguish between the target light and the background light. (b) of FIG. 18 is a difference image obtained by accumulating differences obtained by subtracting, for each pixel, a fluorescence count value of an odd-numbered frame from a fluorescence count value of an even-numbered frame that is adjacent to the odd-numbered frame. That is, the difference image is an accumulated image of "the nth frame–the (n−1)th frame" (where n=2, 4, . . . 1000). In (b) of FIG. 18, fluorescence is imaged in white in a case where a difference is positive, and the fluorescence is imaged in black in a case where the difference is negative.

(c) of FIG. 18 is a selective image obtained by imaging, in white, only pixels each of which had a pixel difference value greater than zero and which were pixels in the difference image that had been obtained by subtracting, for each pixel, the fluorescence count value of the odd-numbered frame from the fluorescence count value of the even-numbered frame that was adjacent to the odd-numbered frame. (d) of FIG. 18 is a merged image obtained by merging the difference image and the selective image. (d) of FIG. 18 is a black-and-white image and is therefore unclear, but it is possible to visually recognize fluorescence as the target light by superposing the accumulated image and a plus image of the difference image and causing the fluorescence present at the same location to be displayed in a different color.

Figure 19:
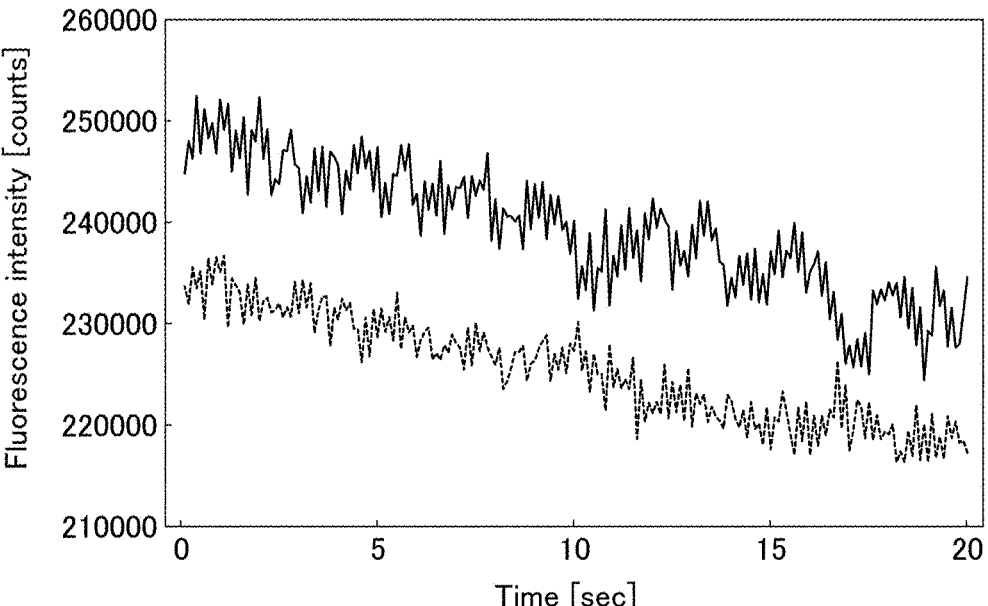
FIG. 19 is a time-series graph showing changes in fluorescence intensity of target light and changes in fluorescence intensity of background light, in accordance with Example 5.

FIG. 19 is a time-series graph showing changes in the fluorescence intensity of the target light indicated by a solid-line circle in FIG. 18(*b*) and changes in the fluorescence intensity of the background light indicated by a dotted-line circle in FIG. 18(*b*). The fluorescence intensity of the background light is high in the odd-numbered frames, in synchronization with the modulation of the intensity of the green laser. On the other hand, the intensity of the target light is low in the odd-numbered frames in each of which irradiation with the microwave was carried out. Therefore, the fluorescence intensity of the target light is high in the even-numbered frames. Therefore, as shown in FIG. 19, the intensity of the target light and the intensity of the background light change in opposite phase. Regarding the changes in the intensity of the target light, the reason why the intensity of the target light becomes lower in the odd-numbered frames than in the even-numbered frames is that decreases in the intensity of the target light which decreases are caused by the microwave in the odd-numbered frames are greater than decreases in the intensity of the target light which decreases are caused by decreases in intensity of the green laser in the even-numbered frames.

Figure 20:
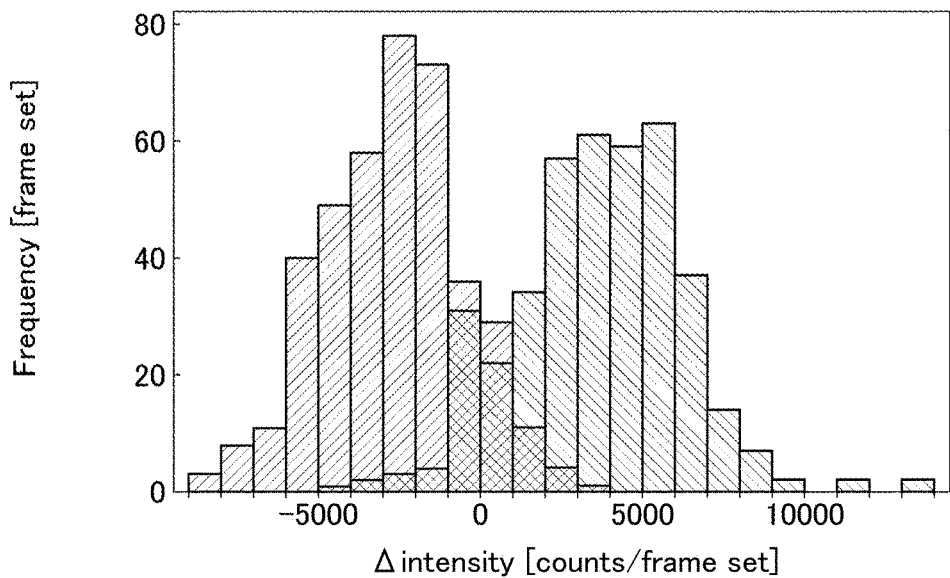
FIG. 20 is a histogram of differences in the intensity of the target light and the intensity of the background light between adjacent frames, in accordance with Example 5.

FIG. 20 is a histogram of differences in the intensity of the target light and the intensity of the background light in (b) of FIG. 18 between adjacent frames (even-numbered frame–odd-numbered frame). As described above, the intensity of the target light is high in the even-numbered frames, and therefore the differences are positive. The intensity of the background light is high in the odd-numbered frames, and therefore the differences are negative. Note, however, that, since a fluorescence signal is weak and thus noise occurs in the signal due to fluctuations in a detector and/or excitation light, shot noise, and the like, there are parts that are reversed.

Example 6

Fluorescent nanodiamonds were each modified with an antibody of phosphorylated tau protein (pTau), and the antibody and pTau were bound. Thereafter, the nanodiamonds each modified with the antibody to which the pTau was bound were bound to an antibody of tau protein (Tau) which antibody was immobilized on a glass substrate, and then fluorescence generated by excitation was imaged.

Figure 21:
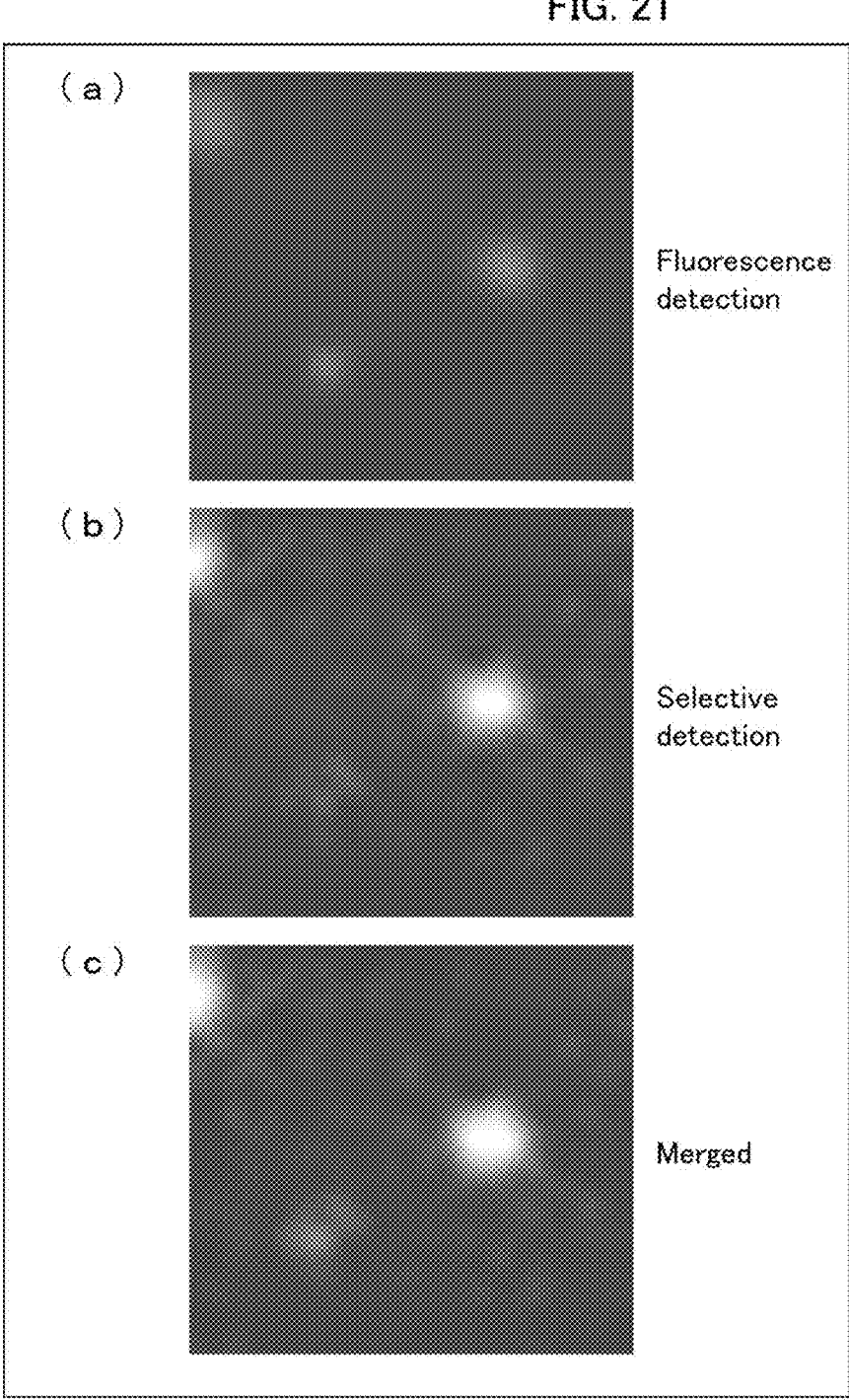
FIG. 21 shows fluorescence images obtained and processed in Example 6.

(a) of FIG. 21 is an accumulated image (fluorescence detection image) obtained from frames which were captured under the conditions described in Example 5. (c) of FIG. 21 is a selective image obtained by imaging, in white, only pixels each of which had a pixel difference value greater than zero and which were pixels in a difference image that had been obtained by subtracting, for each pixel, a fluorescence count value of an odd-numbered frame from a fluorescence count value of an even-numbered frame that was adjacent to the odd-numbered frame. In (b) of FIG. 21, only the nanodiamonds modified with the antibody to which the pTau was bound were detected. (c) of FIG. 21 is a merged image obtained by merging the fluorescence detection image and the selective image obtained by the method described in Example 5. Although (c) of FIG. 21 is unclear, it is possible to visually recognize fluorescence as target light by causing the fluorescence present at the same location in the fluorescence detection image and the selective image to be displayed in a different color.

A bright spot visible only in the accumulated image is a bright spot based on background light, and could be eliminated in the selective image. That is, the bright spot visible in the selective image is the fluorescence derived from the pTau. Tau protein is a substance that causes dementia by abnormally accumulating in a brain. pTau is a biomarker molecule detected by abnormal accumulation thereof. Detecting pTau is important also for diagnosing dementia. By using an antibody-modified nanodiamond as in the present example, it is possible to easily detect phosphorylated tau protein in a body fluid.

REFERENCE SIGNS LIST 1, 2, 3, 4, 5 Fluorescence detection device
11 First generating section
111 Excitation light generating part
112 First modulating part
113 First laser oscillator
114 Intensity modulating part
115 Laser oscillator
116 Modulating part
12 Second generating section
121 Magnetic field generating part
122 Second modulating part
123 Electromagnetic wave generating part
124 Third modulating part
125 Second laser oscillator
126 Pulse frequency modulating part
130 Microwave generating part
13 Control section
14 Detecting section
15 Signal processing section
100 Phosphor

The invention claimed is:

1. A fluorescence detection device comprising:
a first generating section that generates excitation light whose intensity is modulated and which excites a phosphor, wherein the phosphor contains at least one selected from the group consisting of: an NV center of a diamond which NV center contains a nitrogen atom that substitutes for a carbon atom and a vacancy defect that is adjacent to the nitrogen atom; an SiV center of a diamond which SiV center contains a silicon atom that substitutes for a carbon atom and a vacancy defect that is adjacent to the silicon atom; a $V_{Si}V_C$ center of a silicon carbide crystal which $V_{Si}V_C$ center contains a vacancy defect that substitutes for a silicon atom and a vacancy defect that is adjacent to the vacancy defect; and a $V_{Si}$ center of a silicon carbide crystal which $V_{Si}$ center contains a vacancy defect that substitutes for a silicon atom;
a second generating section that generates a magnetic field which causes magnetic resonance so that intensity of fluorescence emitted from the phosphor is changed;

the first generating section includes an excitation light generating part that generates the excitation light and a first modulating part that modulates the intensity of the excitation light with use of a carrier wave having at least one of a first frequency and a first phase; and
the second generating section includes a magnetic field generating part that generates the magnetic field and a second modulating part that modulates intensity of the magnetic field with use of a carrier wave having at least one of a second frequency differing from the first frequency and a second phase differing from the first phase.

2. The fluorescence detection device as set forth in claim 1, wherein modulation amplitude of background light is smaller than modulation amplitude of the fluorescence from the phosphor, the modulation amplitude of the background light being a change in intensity of the background light which change is caused by the first modulating part modulating the intensity of the excitation light, the modulation amplitude of the fluorescence from the phosphor being a change in the intensity of the fluorescence from the phosphor which change is caused by the second modulating part modulating the intensity of the magnetic field.

3. The fluorescence detection device as set forth in claim 2, wherein the modulation amplitude of the background light is not more than 5%.

4. The fluorescence detection device as set forth in claim 1 further comprising:
a detecting section including an imaging element for receiving target light and background light, wherein the target light is fluorescence emitted from the phosphor, wherein the background light is fluorescence emitted from an object other than the phosphor, wherein the detecting section is configured to convert the target light and the background light into electric signals; and
a signal processing section for processing the electric signals from the detecting section and identifying the target light and background light.

5. A fluorescence detection device comprising:
a first generating section that generates excitation light whose intensity is modulated and which excites a phosphor, wherein the phosphor contains at least one selected from the group consisting of: an NV center of a diamond which NV center contains a nitrogen atom that substitutes for a carbon atom and a vacancy defect that is adjacent to the nitrogen atom; an SiV center of a diamond which SiV center contains a silicon atom that substitutes for a carbon atom and a vacancy defect that is adjacent to the silicon atom; a $V_{Si}V_C$ center of a silicon carbide crystal which $V_{Si}V_C$ center contains a vacancy defect that substitutes for a silicon atom and a vacancy defect that is adjacent to the vacancy defect; and a $V_{Si}$ center of a silicon carbide crystal which $V_{Si}$ center contains a vacancy defect that substitutes for a silicon atom;
a second generating section that generates an electromagnetic wave, which causes magnetic resonance so that intensity of fluorescence emitted from the phosphor is changed;
the first generating section includes an excitation light generating part that generates the excitation light and a first modulating part that modulates the intensity of the excitation light with use of a carrier wave having at least one of a first frequency and a first phase; and
the second generating section includes an electromagnetic wave generating part that generates the electromagnetic wave and a third modulating part that modulates intensity or a frequency of the electromagnetic wave with use of a carrier wave having at least one of a second frequency differing from the first frequency and a second phase differing from the first phase.

6. The fluorescence detection device as set forth in claim 5, wherein modulation amplitude of background light is smaller than modulation amplitude of the fluorescence from the phosphor, the modulation amplitude of the background light being a change in intensity of the background light which change is caused by the first modulating part modulating the intensity of the excitation light, the modulation amplitude of the fluorescence from the phosphor being a change in the intensity of the fluorescence from the phosphor which change is caused by the third modulating part modulating the intensity or the frequency of the electromagnetic wave.

7. The fluorescence detection device as set forth in claim 5 further comprising:

a detecting section including an imaging element for receiving target light and background light, the target light being fluorescence emitted from the phosphor and the background light being fluorescence emitted from an object other than the phosphor, wherein the detecting section is configured to convert the target light and the background light into electric signals; and a signal processing section for processing the electric signals from the detecting section and identifying the target light and background light.

8. A fluorescence detection method comprising the steps of:

generating, by a first generating section, excitation light whose intensity is modulated with use of a carrier wave having at least one of a first frequency and a first phase; and which excites a phosphor, wherein the phosphor contains at least one selected from the group consisting of: an NV center of a diamond which NV center contains a nitrogen atom that substitutes for a carbon atom and a vacancy defect that is adjacent to the nitrogen atom; an SiV center of a diamond which SiV center contains a silicon atom that substitutes for a carbon atom and a vacancy defect that is adjacent to the silicon atom; a $V_{Si}V_C$ center of a silicon carbide crystal which $V_{Si}V_C$ center contains a vacancy defect that substitutes for a silicon atom and a vacancy defect that is adjacent to the vacancy defect; and a $V_{Si}$ center of a silicon carbide crystal which $V_{Si}$ center contains a vacancy defect that substitutes for a silicon atom; and generating, by a second generating section, at least one of a magnetic field or an electromagnetic wave which causes magnetic resonance so that intensity of fluorescence emitted from the phosphor is changed, wherein intensity of the magnetic field or intensity of the electromagnetic wave is modulated with use of a carrier wave having at least one of a second frequency differing from the first frequency and a second phase differing from the first phase.

9. The fluorescence detection method of claim 8 further comprising:

receiving, by a detecting section including an imaging element, target light and background light, the target light being fluorescence emitted from the phosphor and the background light being fluorescence emitted from an object other than the phosphor;

converting the target light and the background light to electric signals;

processing, by a signal processing section, the electric signals from the detecting section; and identifying, by the signal processing section, the target light and background light based on the electric signals.

* * * * *